United States Patent
Ito

(10) Patent No.: US 11,231,438 B2
(45) Date of Patent: Jan. 25, 2022

(54) INERTIAL SENSOR, ELECTRONIC DEVICE, AND VEHICLE

(71) Applicant: SEIKO EPSON CORPORATION, Tokyo (JP)

(72) Inventor: Fumiya Ito, Chikuma (JP)

(73) Assignee: Seiko Epson Corporation, Tokyo (JP)

(*) Notice: Subject to any disclaimer, the term of this patent is extended or adjusted under 35 U.S.C. 154(b) by 222 days.

(21) Appl. No.: 16/723,490

(22) Filed: Dec. 20, 2019

(65) Prior Publication Data

US 2020/0200791 A1 Jun. 25, 2020

(30) Foreign Application Priority Data

Dec. 25, 2018 (JP) .............................. JP2018-240838

(51) Int. Cl.
*G01P 1/00* (2006.01)
*G01P 15/08* (2006.01)
*B81B 7/00* (2006.01)
*G01P 1/02* (2006.01)

(52) U.S. Cl.
CPC .......... *G01P 15/0802* (2013.01); *B81B 7/007* (2013.01); *G01P 1/023* (2013.01); *B81B 2201/0235* (2013.01); *B81B 2207/092* (2013.01)

(58) Field of Classification Search
CPC ....... B81B 7/007; G01P 1/023; G01P 15/0802
See application file for complete search history.

(56) References Cited

U.S. PATENT DOCUMENTS

| 2010/0176466 | A1  | 7/2010 | Fujii et al. |
| 2011/0126632 | A1* | 6/2011 | McNeil ............... G01L 19/0092 73/718 |
| 2017/0074658 | A1* | 3/2017 | Tanaka ............... G01C 19/5755 |
| 2018/0148325 | A1* | 5/2018 | Duqi .................... B81C 1/00238 |
| 2019/0107397 | A1* | 4/2019 | Ito ........................ G01C 21/20 |

FOREIGN PATENT DOCUMENTS

| CN | 107063313 | 8/2017 |
| JP | H01112468 | 7/1989 |
| JP | 2010161266 | 7/2010 |
| JP | 2011095010 | 5/2011 |
| JP | 2017-003508 | 1/2017 |
| JP | 2018072170 | 5/2018 |
| JP | 2018091819 | 6/2018 |
| WO | 2017104103 | 6/2017 |

* cited by examiner

Primary Examiner — Jamel E Williams
(74) Attorney, Agent, or Firm — Workman Nydegger

(57) ABSTRACT

An inertial sensor includes a substrate, a first detection element that is provided on a first surface of the substrate and includes a first movable portion displaceable with respect to the substrate and a first fixed portion connected to the first movable portion and fixed to the substrate, and a second detection element that is provided on a second surface in a front-back relationship with the first surface and includes a second movable portion displaceable with respect to the substrate and a second fixed portion connected to the second movable portion and fixed to the substrate.

11 Claims, 17 Drawing Sheets

INERTIAL SENSOR, ELECTRONIC DEVICE, AND VEHICLE

The present application is based on, and claims priority from JP Application Serial Number 2018-240838, filed Dec. 25, 2018, the disclosure of which is hereby incorporated by reference herein in its entirety.

BACKGROUND

1. Technical Field

The present disclosure relates to an inertial sensor, an electronic device, and a vehicle.

2. Related Art

An acceleration sensor described in International Publication No. WO 2017/104103 includes an anchor portion, a movable electrode portion that is swingably supported by the anchor portion through a spring portion, and a fixed electrode portion that faces the movable electrode portion. In such a configuration, when acceleration is applied, the movable electrode portion swings and accordingly, since a gap between the movable electrode portion and the fixed electrode portion changes and capacitance between the movable electrode portion and the fixed electrode portion changes, acceleration can be measured based on the change in the capacitance.

However, since the acceleration sensor described in International Publication No. WO 17/104103 has a configuration in which a plurality of sensor elements are formed on one surface of one substrate, a grounding area on the XY plane increases in proportion to the number and area of sensor elements. That is, in the acceleration sensor described in International Publication No. WO 2017/104103, it is difficult to achieve miniaturization of an apparatus.

SUMMARY

An inertial sensor according to an aspect of the present disclosure includes a substrate, a first detection element that is provided on a first surface of the substrate and includes a first movable portion displaceable with respect to the substrate and a first fixed portion connected to the first movable portion and fixed to the substrate, and a second detection element that is provided on a second surface in a front-back relationship with the first surface and includes a second movable portion displaceable with respect to the substrate and a second fixed portion connected to the second movable portion and fixed to the substrate.

The inertial sensor may include a first lid body that forms a first space with the first surface and a second lid body that forms a second space with the second surface, and in which the first detection element may be accommodated in the first space, the second detection element may be accommodated in the second space, the first lid body may be provided with a first hole sealed with a sealing material, and the substrate may be provided with a second hole making the first space and the second space communication with each other.

The inertial sensor may include a plurality of first terminals provided outside the first space on the first surface, a plurality of second terminals provided on the second surface and provided in the second space, and a penetrating electrode provided on the substrate and electrically coupling any one of the plurality of first terminals and any one of the plurality of second terminals, and in which any one of the plurality of first terminals may be electrically coupled to the first detection element and any one of the plurality of second terminals may be electrically coupled to the second detection element.

In the inertial sensor, the first lid body may be provided between one first terminal of the plurality of first terminals and another first terminal different from the one first terminal.

The inertial sensor may include a third detection element that is provided on the first surface and includes a third movable portion displaceable with respect to the substrate and a third fixed portion connected to the third movable portion and fixed to the substrate, and in which, in a plan view of the substrate, when the substrate is rectangular, the first detection element and the third detection element may be provided at line-symmetric positions with respect to a line parallel to the first surface and passing through an intersection point of diagonal lines of the substrate.

The inertial sensor may include a third detection element that is provided on the first surface and includes a third movable portion displaceable with respect to the substrate and a third fixed portion connected to the third movable portion and fixed to the substrate, and in which, in a plan view of the substrate, when the substrate is rectangular, the first detection element and the third detection element may be provided at point-symmetric positions with respect to intersection point of diagonal lines of the substrate.

In the inertial sensor, in a plan view of the substrate, when the substrate is rectangular, the second hole may be provided at a position where the second hole overlaps an intersection point of diagonal lines of the substrate.

In the inertial sensor, the second hole may be provided at a position where the second hole does not overlap the first detection element in a plan view of the substrate.

In the inertial sensor, the first fixed portion and the second fixed portion may be provided at positions where the first and second fixed portions do not overlap each other in a plan view of the substrate.

An electronic device according to another aspect of the present disclosure includes the inertial sensor described above and a processing unit that processes an output from the inertial sensor.

A vehicle according to another aspect of the present disclosure includes the inertial sensor described above and a processing unit that processes an output from the inertial sensor.

DESCRIPTION OF EXEMPLARY EMBODIMENTS

Figure 1:
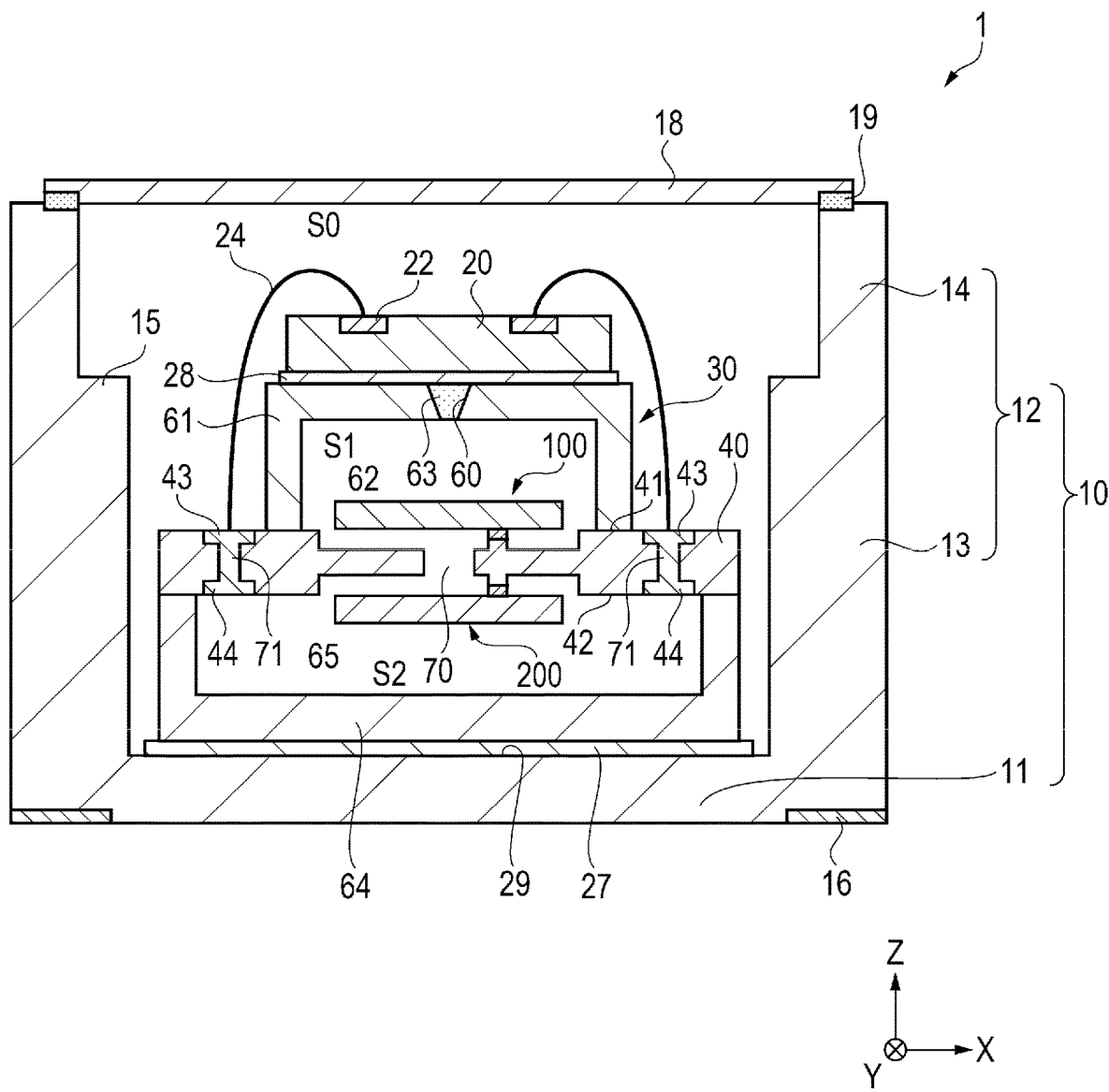
FIG. 1 is a cross-sectional view of an inertial sensor module including an inertial sensor according to Embodiment 1.

Hereinafter, an inertial sensor, an electronic device, and a vehicle according to embodiments of the present disclosure will be described with reference to the drawings. The embodiment described below does not limit contents of the present disclosure described in the appended claims. Not all of the configurations described in the embodiments are essential constituent elements of the present disclosure. The drawings are schematic, and in the drawings, the constitution elements may differ from actual dimensions and relative proportions of dimensions, arrangements, structures, materials, and the like thereof. The relationship among dimensions, arrangement, structure, and the like between the drawings is not always strictly matched. In the coordinates appended to the drawings, the X-axis, Y-axis, and Z-axis are illustrated as three axes orthogonal to each other. A direction along the X-axis, that is, a direction parallel to the X-axis is referred to as an "X-axis direction", a direction along the Y-axis, that is, a direction parallel to the Y-axis is referred as a "Y-axis direction", and a direction along the Z-axis, that is, a direction parallel to the Z-axis is referred as a "Z-axis direction". A tip end side of the arrow of each axis is also referred to as a "plus side", and the opposite side is also referred to a "minus side". In addition, the plus side in the Z-axis direction is also referred to as "upper", and the minus side in the Z-axis direction is also referred to as "lower".

Embodiment 1

Figure 2:
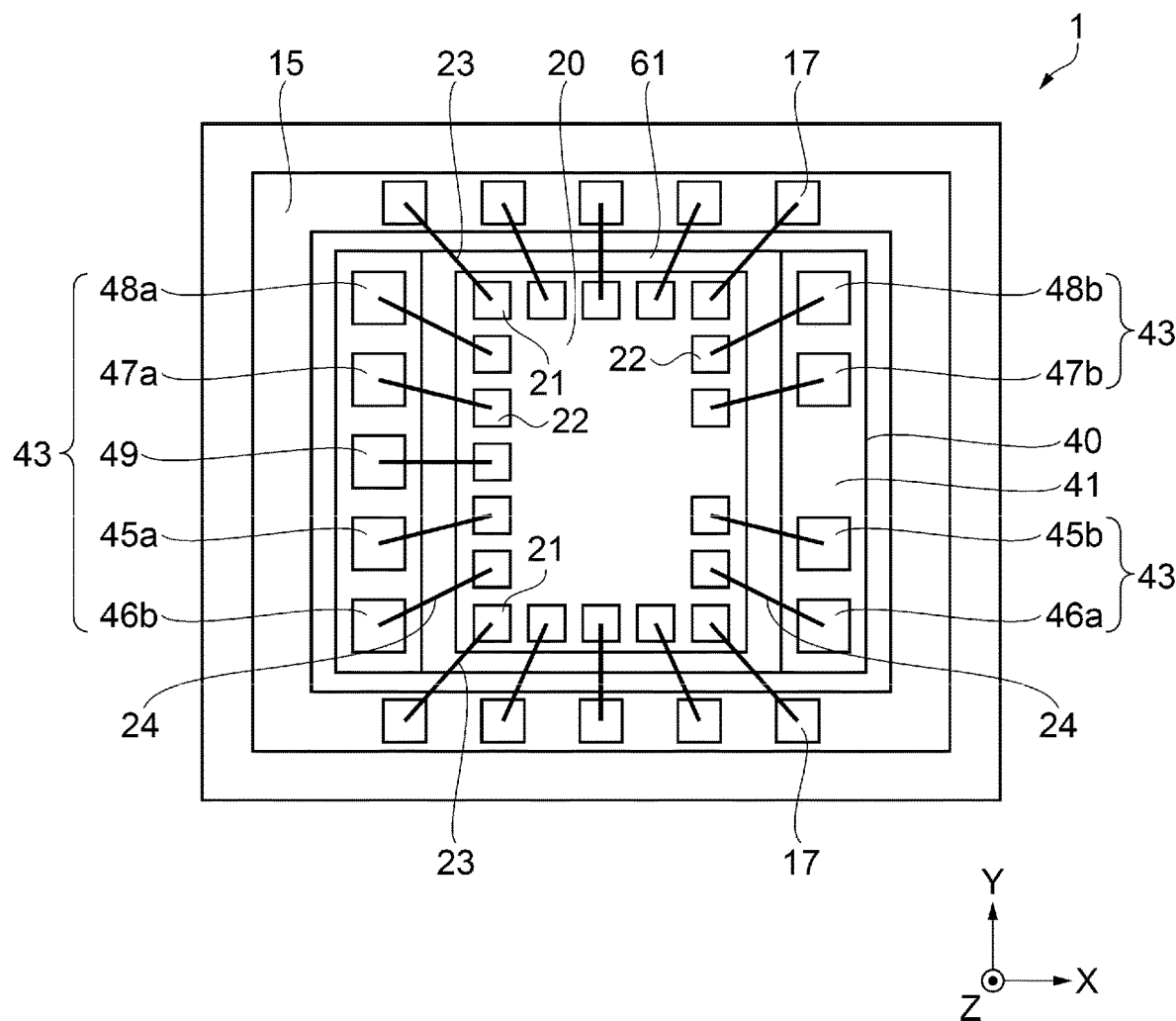
FIG. 2 is a plan view of the inertial sensor module illustrated in FIG. 1.

FIG. 1 is a cross-sectional view of an inertial sensor module 1 having an inertial sensor according to Embodiment 1. FIG. 2 is a plan view of the inertial sensor module 1 illustrated in FIG. 1.

First, a schematic configuration of the inertial sensor module 1 will be described.

The inertial sensor module 1 is an acceleration sensor module that can measure acceleration Ax in the X-axis direction, acceleration Ay in the Y-axis direction, and acceleration Az in the Z-axis direction. The inertial sensor module 1 includes an inertial sensor 30 and an IC 20 that processes a signal output from the inertial sensor 30 inside a casing 10, and is hermetically sealed by a lid 18.

As illustrated in FIG. 1, the casing 10 includes a rectangular flat plate-like bottom portion 11 and frame-like side walls 12 provided perpendicularly to the bottom portion 11 from a peripheral edge portion of the bottom portion 11, and each side wall 12 includes a thick portion 13 connected to the bottom portion 11 and a thin portion 14 thinner than the thick portion 13 and connected to the upper end of the thick portion 13. The outer surface of the side wall 12 is configured by four flat surfaces that are continuous from the thick portion 13 to the thin portion 14, respectively. The inner surface of each side wall 12 includes a step portion 15 that is the upper surface of the thick portion 13.

The casing 10 can be formed from various ceramic materials including, for example, alumina ($Al_2O_3$), aluminum nitride (AlN), silicon nitride ($Si_3N_4$), beryllia (BeO), and the like. In addition, as the material of the casing 10, various materials that meet requirements of stiffness and thermal expansion coefficient for design, such as resin, metal, and glass, can be adopted.

As illustrated in FIG. 1 or 2, the casing 10 includes a plurality of external terminals 16 that are spaced apart from each other and disposed on the bottom surface of the bottom portion 11 and a plurality of internal terminals 17 that are spaced apart from each other and disposed on the top surface of the step portion 15.

Each of the external terminals 16 and the internal terminals 17 can be formed by firing first metal such as tungsten (W) or molybdenum (Mo) patterned by screen printing or the like and plating second metal such as nickel (Ni) or gold (Au).

Some of the plurality of external terminals 16 are electrically coupled to the internal terminals 17 through internal wirings (not illustrated) provided in the casing 10. In addition, illustrations of some of wiring, terminals, and the like provided in the casing 10 are omitted for the sake of simplicity of explanation. The meaning of "electrically coupled" is not limited to a state where two targets are at the same potential, but includes a state where two targets are coupled through an electric circuit.

The lid 18 is bonded to the top surface of the thin portion 14, that is, the top surface of the side wall 12 through a sealing material 19. The lid 18 defines an accommodation space S0, in which the inertial sensor 30 and the IC 20 are accommodated, together with the casing 10 by closing an opening of a cavity of the casing 10. An accommodation space S0 is defined as a hermetically sealed space surrounded by the upper surface of the bottom portion 11, the inner surface of the side wall 12, and the lower surface of the lid 18.

As the material of the lid 18, various materials such as a metal material such as Kovar, glass, silicon, a resin material, and ceramics can be adopted. The lid 18 may have a laminated structure in which a plurality of flat plates made of different types of materials are adhered together. As the sealing material 19, for example, a seal ring made of a metal material, a resin material, low-melting glass, or the like can be adopted. The accommodation space S0 is a reduced-pressure atmosphere lower than atmospheric pressure or an atmosphere of an inert gas such as nitrogen ($N_2$), argon (Ar), helium (He), or the like.

The inertial sensor 30 is a MEMS sensor manufactured using, for example, a micro electro mechanical system (MEMS) obtained by developing semiconductor manufacturing technology. The inertial sensor 30 is attached to the upper surface of the bottom portion 11 through a first adhesive layer 27. The inertial sensor 30 includes a plurality of first terminals 43 disposed on the upper surface of a substrate 40, which will be described later, exposed in the accommodation space S0.

The inertial sensor 30 includes a first detection element 100 and a second detection element 200, but is schematically illustrated in a rectangular parallelepiped shape in FIG. 1. A more specific configuration of the inertial sensor 30 including the first detection element 100 and the second detection element 200 will be described later. An example of a method for manufacturing the inertial sensor 30 will be described later.

The IC 20 is an integrated circuit that outputs data indicating acceleration by processing a signal output from the inertial sensor 30. The IC 20 has a substantially rectangular parallelepiped shape. The IC 20 is attached to the upper surface of the inertial sensor 30, that is, a surface opposite to the lower surface in contact with the first adhesive layer 27 through a second adhesive layer 28, and is accommodated in the casing 10. The IC 20 includes a plurality of first connection terminals 21 and a plurality of second connection terminals 22 disposed on the upper surface exposed in the accommodation space S0.

As a material of the first adhesive layer 27 and the second adhesive layer 28, for example, a die attach material that is a resin-based adhesive such as epoxy resin or silicone resin can be adopted. In addition, as the first adhesive layer 27 and the second adhesive layer 28, solder or nano silver paste can be adopted.

The inertial sensor module 1 further includes a plurality of wires that are bonding wires electrically coupling terminals that are respectively provided on the inertial sensor 30, the IC 20, and the casing 10. As illustrated in FIG. 2, the wires are divided into a plurality of first wires 23 that electrically couple the internal terminals 17 of the casing 10 and the first connection terminals 21 of the IC 20, respectively, and a plurality of second wires 24 that electrically couple the first terminals 43 of the inertial sensor 30 and the second connection terminals 22 of the IC 20.

The IC 20 receives the signal output from the first terminal 43 according to acceleration of the inertial sensor 30 from the second connection terminal 22 through the second wire 24. The IC 20 processes the signal input from the second connection terminal 22, converts the signal into a signal indicating acceleration, and outputs the signal from the first connection terminal 21. The signal output from the first connection terminal 21 is transmitted to the internal terminal 17 through the first wire 23.

Figure 3:
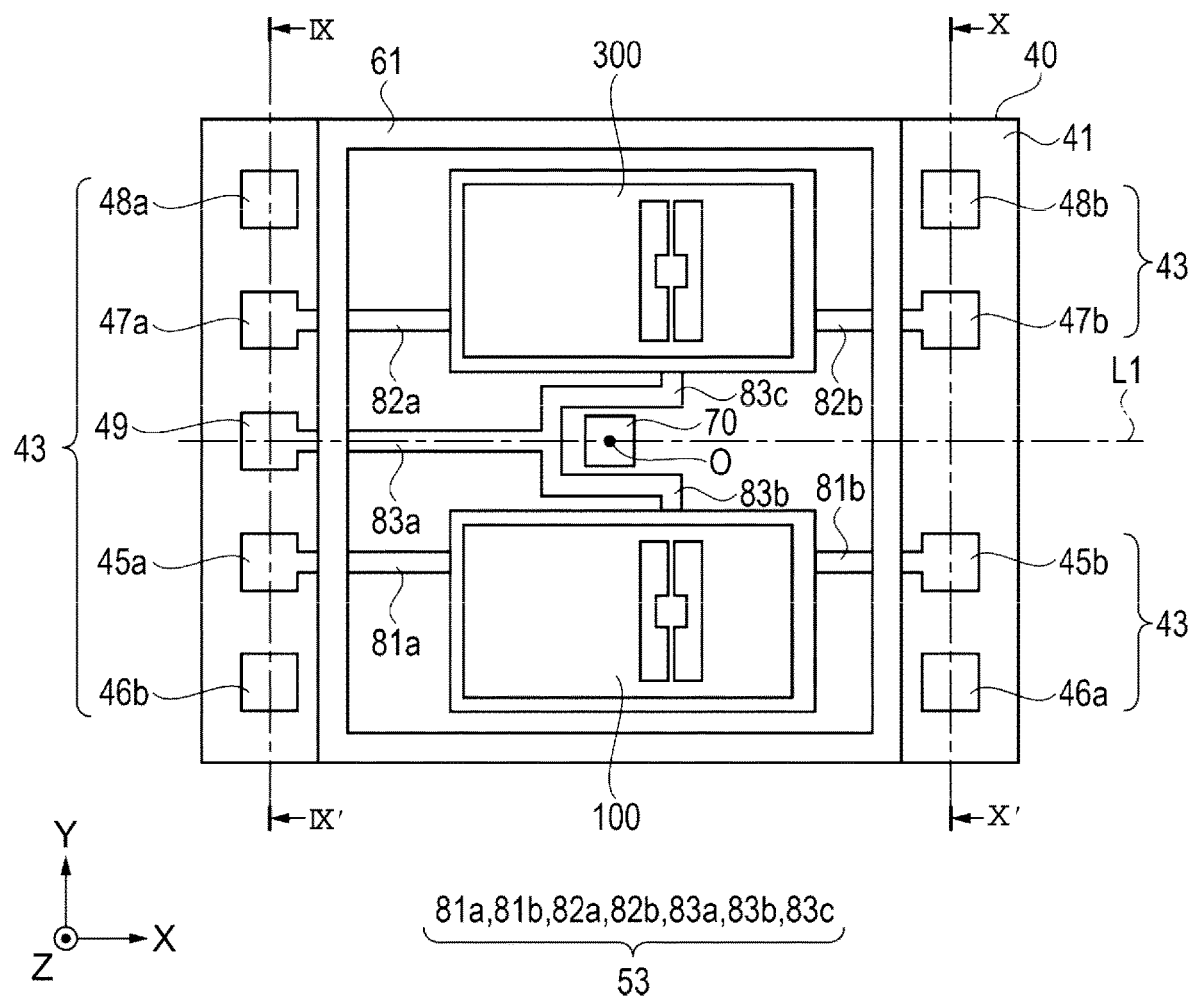
FIG. 3 is a plan view of a first surface of a substrate included in the inertial sensor illustrated in FIG. 1.
Figure 4:
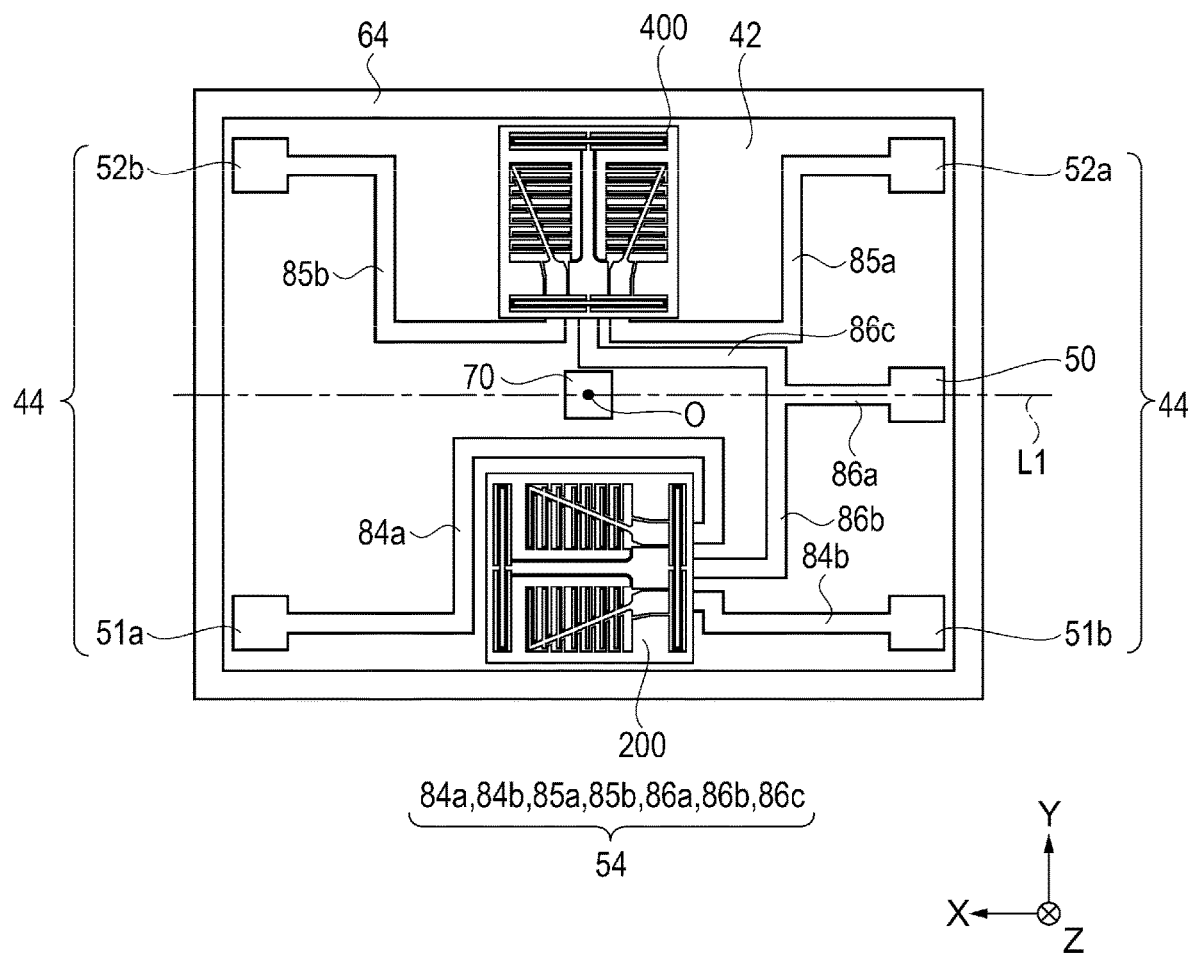
FIG. 4 is a plan view of a second surface of the substrate included in the inertial sensor illustrated in FIG. 1.
Figure 5:
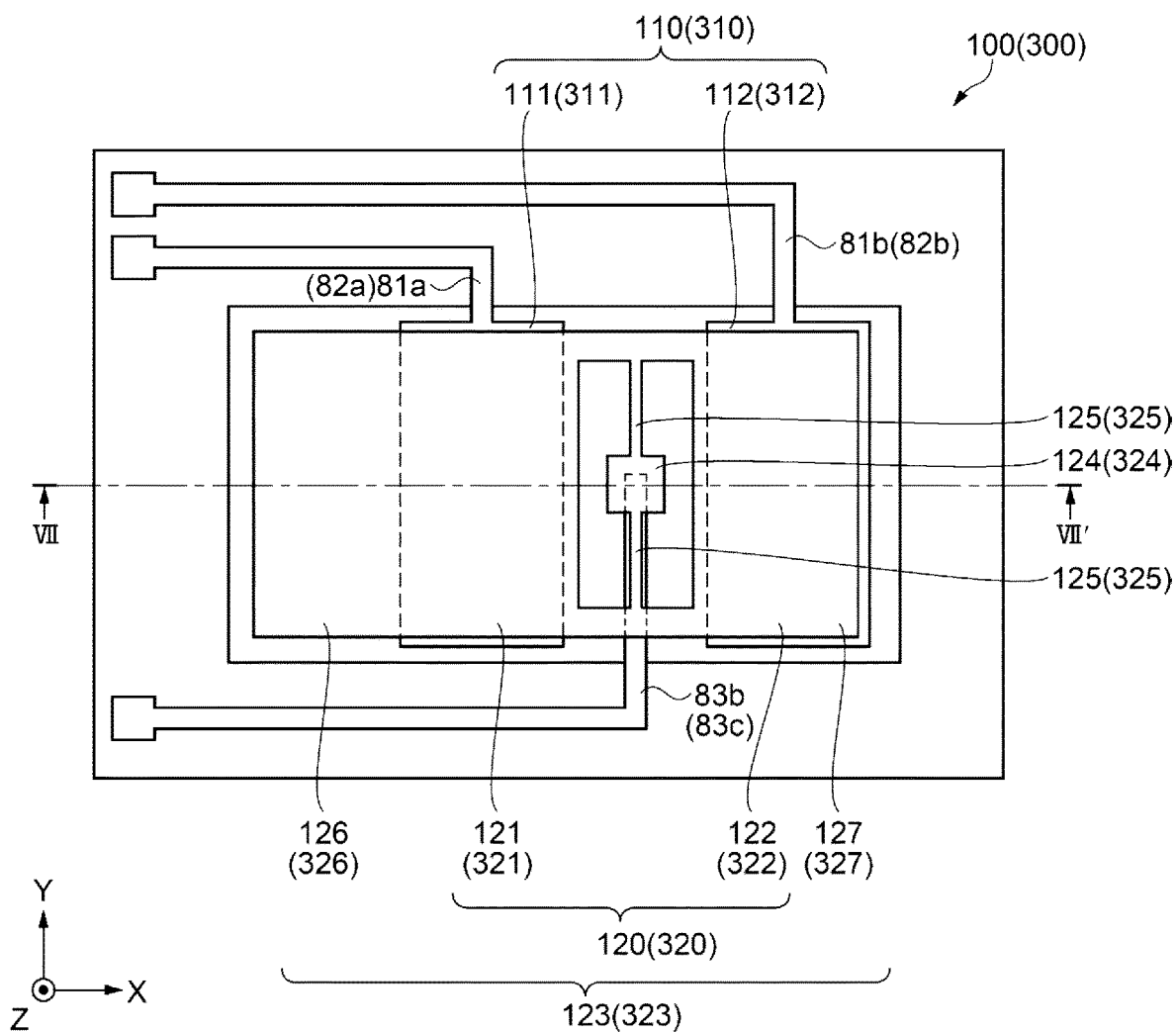
FIG. 5 is a plan view of a first detection element and a third detection element included in the inertial sensor illustrated in FIG. 1.
Figure 6:
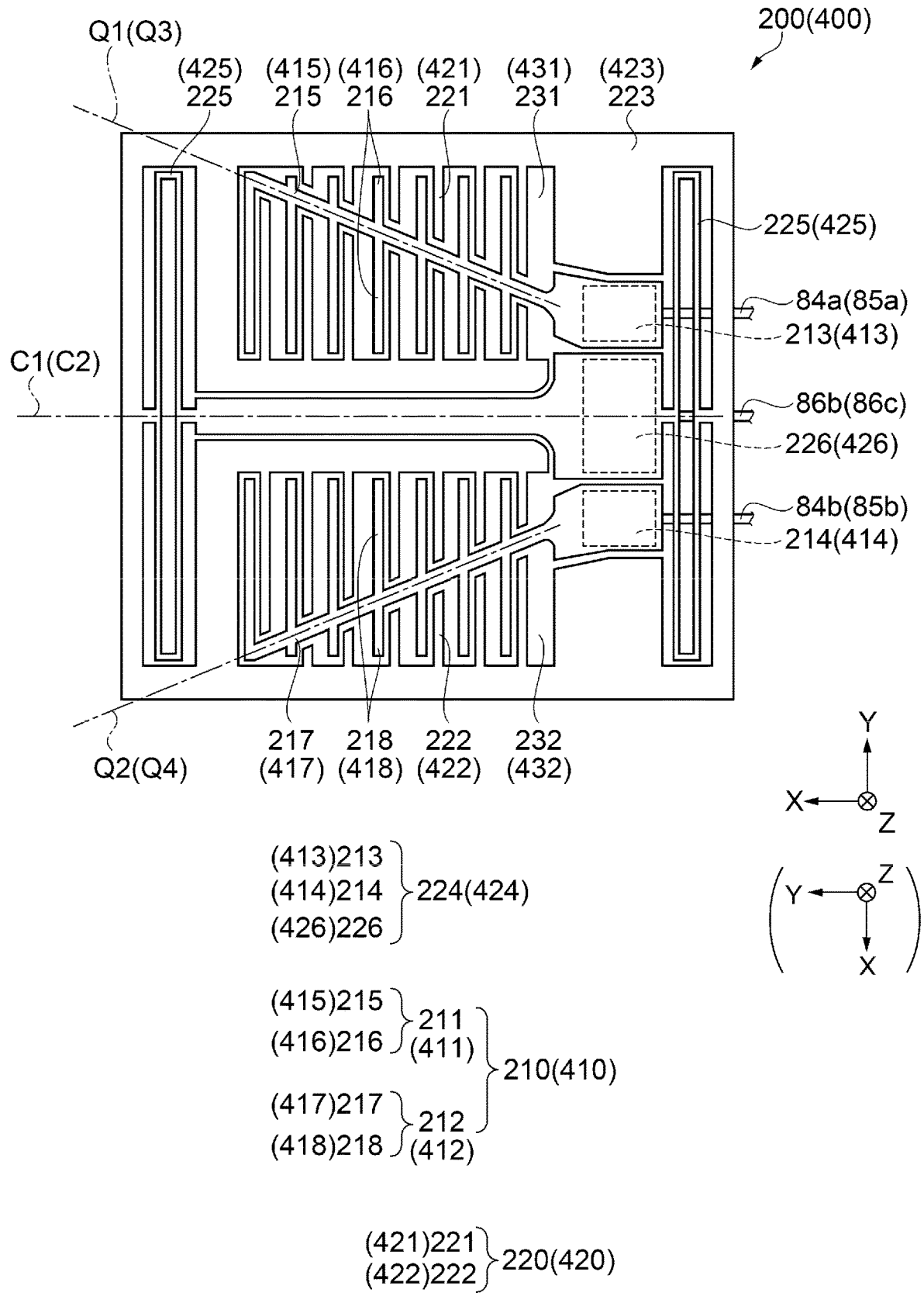
FIG. 6 is a plan view of a second detection element included in the inertial sensor illustrated in FIG. 1.
Figure 7:
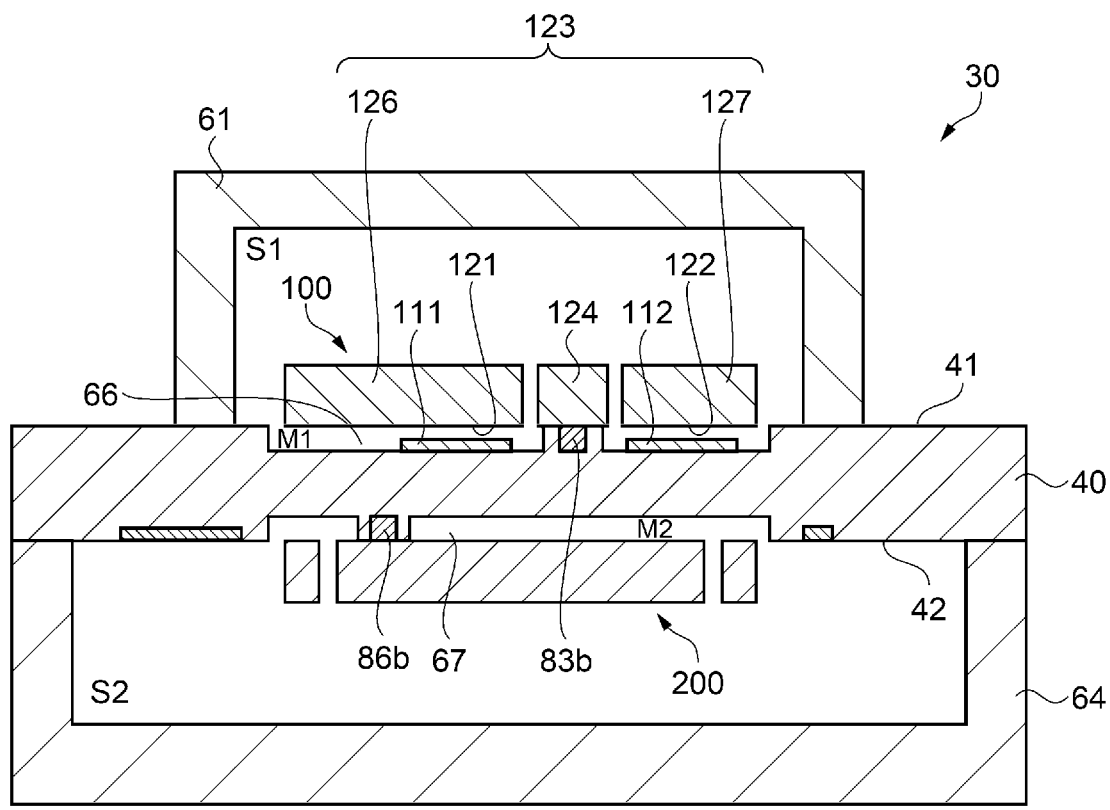
FIG. 7 is a cross-sectional view taken along line VII-VII' illustrated in FIG. 5.
Figure 7:
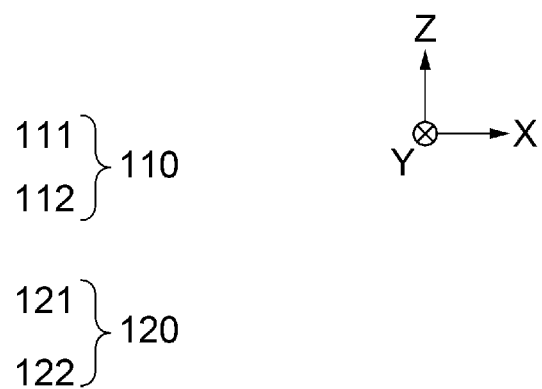

FIG. 3 is a plan view of a first surface 41 of the substrate 40 included in the inertial sensor 30. FIG. 4 is a plan view of a second surface 42 of the substrate 40 included in the inertial sensor 30. FIG. 5 is a plan view of the first detection element 100 and a third detection element 300 included in the inertial sensor 30. FIG. 6 is a plan view of the second detection element 200 and a fourth detection element 400 included in the inertial sensor 30. FIG. 7 is a cross-sectional view taken along line VII-VII' illustrated in FIG. 5.

As illustrated in FIG. 1, FIG. 3, or FIG. 4, the inertial sensor 30 is configured by the substrate 40, the first detection element 100 and the third detection element 300 disposed on the first surface 41 of the substrate 40, the second detection element 200 and the fourth detection element 400 disposed on the second surface 42 of the substrate 40, a first lid body 61 bonded to the substrate 40 so as to cover the first detection element 100 and the third detection element 300, a second lid body 64 bonded to the substrate 40 so as to cover the second detection element 200 and the fourth detection element 400, and the like. Here, the first surface 41 of the substrate 40 refers to the upper surface of the two surfaces of the substrate 40 perpendicular to the Z-axis, and the second surface 42 of the substrate 40 refers to the lower surface of the two surfaces of the substrate 40 that are perpendicular to the Z-axis. Unless otherwise stated, the substrate 40 is treated as a rectangle in a plan view.

The first detection element 100 is a sensor element that measures the acceleration Az in the Z-axis direction. As illustrated in FIG. 3 or FIG. 5, the first detection element 100 includes a first fixed electrode 110 formed on the first surface 41 of the substrate 40, a first fixed portion 124 fixed to the first surface 41 of the substrate 40, a first movable portion 123 that is displaced with respect to the first fixed portion 124, a first spring portion 125 that connects the first fixed portion 124 and the first movable portion 123, and a first movable electrode 120 provided in the first movable portion 123.

An outline of the first movable portion 123 is rectangular in a plan view from the Z-axis direction, and the first fixed portion 124 and the first spring portion 125 are provided inside the outline. The first movable portion 123 extends in the XY plane so that the longitudinal direction is the X-axis direction, and is configured such that the minus side of the X-axis is longer than the plus side thereof.

The first movable portion 123 is configured by movable portions 126 and 127. The movable portion 126 is a longitudinal portion of the first movable portion 123 positioned on the minus side of the X-axis with the first fixed portion 124 as a reference. The movable portion 127 is a short portion of the first movable portion 123 positioned on the plus side of the X-axis with the first fixed portion 124 as a reference.

The first movable electrode 120 is integral with the first movable portion 123, and is provided on the back surface of the first movable portion 123, that is, on the surface facing the first fixed electrode 110. The first movable electrode 120 is configured by movable electrodes 121 and 122, the movable electrode 121 is provided on the movable portion 126, and the movable electrode 122 is provided on the movable portion 127.

The first fixed electrode 110 is configured by fixed electrodes 111 and 112. The fixed electrode 111 is provided to face the movable electrode 121 through a gap, and the fixed electrode 112 is provided to face the movable electrode 122 through a gap.

The third detection element 300 is a sensor element that has a similar shape to the first detection element 100, and measures the acceleration Az in the Z-axis direction, similar to the first detection element 100. As illustrated in FIG. 5, the third detection element 300 includes a third fixed electrode 310 formed on the first surface 41 of the substrate 40, a third fixed portion 324 fixed to the first surface 41 of the substrate 40, a third movable portion 323 that is displaced with respect to the third fixed portion 324, a third spring portion 325 that connects the third fixed portion 324 and the third movable portion 323, and a third movable electrode 320 provided in the third movable portion 323.

An outline of the third movable portion 323 is rectangular in a plan view from the Z-axis direction, and the third fixed portion 324 and the third spring portion 325 are provided inside the outline. The third movable portion 323 extends in the X-axis direction and is configured so that the minus side of the X-axis is longer than the plus side thereof.

The third movable portion 323 is configured by movable portions 326 and 327. The movable portion 326 is a longitudinal portion of the third movable portion 323 positioned on the minus side of the X-axis with the third fixed portion 324 as a reference. The movable portion 327 is a short portion of the third movable portion 323 positioned on the plus side of the X-axis with the third fixed portion 324 as a reference.

The third movable electrode 320 is integral with the third movable portion 323, and is provided on the back surface of the third movable portion 323, that is, the surface facing the third fixed electrode 310. The third movable electrode 320 is configured by movable electrodes 321 and 322, the movable electrode 321 is provided on the movable portion 326, and the movable electrode 322 is provided on the movable portion 327.

The third fixed electrode 310 is configured by fixed electrodes 311 and 312. The fixed electrode 311 is provided to face the movable electrode 321 through a gap, and the fixed electrode 312 is provided to face the movable electrode 322 through a gap.

The inertial sensor 30 measures the acceleration Az in the Z-axis direction by detecting a change in the gap between the first fixed electrode 110 and the first movable electrode 120 of the first detection element 100 and a change in the gap between the third fixed electrode 310 and the third movable electrode 320 of the third detection element 300, as a change in capacitance.

The second detection element 200 is a sensor element that measures the acceleration Ax in the X-axis direction. As illustrated in FIG. 4 or FIG. 6, the second detection element 200 includes a second fixed portion 224 fixed to the second surface 42 of the substrate 40, and a second fixed electrode 210 fixed to the second fixed portion 224, a second movable portion 223 that is displaced with respect to the second fixed portion 224, a second spring portion 225 that connects the second fixed portion 224 and the second movable portion 223, and a second movable electrode 220 provided on the second movable portion 223.

The second fixed electrode 210 is configured by fixed electrodes 211 and 212. The second fixed portion 224 is configured by fixed portions 213, 214, and 226.

An outline of the second movable portion 223 is rectangular in a plan view from the Z-axis direction, and the second fixed portion 224, the second spring portion 225, and the second fixed electrode 210 are provided inside the outline. The second movable portion 223 includes a first opening 231 which is positioned on the plus side in the Y-axis direction with respect to the fixed portion 226 and in which the fixed electrode 211 and a first movable electrode finger 221 are disposed inside thereof and a second opening 232 which is positioned on the minus side in the Y-axis direction with respect to the fixed portion 226 and in which the fixed electrode 212 and a second movable electrode finger 222 are disposed inside thereof.

The fixed portion 213 is provided on the plus side in the Y-axis with the fixed portion 226 as a reference. The fixed portion 214 is provided on the minus side in the Y-axis with the fixed portion 226 as a reference.

The fixed electrode 211 is fixed to the fixed portion 213. The fixed electrode 211 includes a first trunk portion 215 supported by the fixed portion 213, and a plurality of first fixed electrode fingers 216 extending from the first trunk portion 215 to both sides in the Y-axis direction. The plurality of first fixed electrode fingers 216 are provided apart from each other along the X-axis direction.

The first trunk portion 215 has a rod shape, one end of which is coupled to the fixed portion 213, and the other end is a free end. The first trunk portion 215 extends along an axis Q1 inclined with respect to each of the X-axis and the Y-axis in a plan view from the Z-axis direction. As illustrated in FIG. 6, the axis Q1 is inclined so that the distance from a central axis C1 increases toward the plus side in the X-axis direction.

The fixed electrode 212 is fixed to the fixed portion 214. The fixed electrode 212 includes a second trunk portion 217 supported by the fixed portion 214, and a plurality of second fixed electrode fingers 218 extending from the second trunk portion 217 to both sides in the Y-axis direction. The plurality of second fixed electrode fingers 218 are provided apart from each other along the X-axis direction.

The second trunk portion 217 has a rod shape, one end of which is coupled to the fixed portion 214, and the other end is a free end. The second trunk portion 217 extends along an axis Q2 that is inclined with respect to each of the X-axis and the Y-axis in a plan view from the Z-axis direction. The axis Q2 is inclined so that the distance from the central axis C1 increases toward the plus side in the X-axis direction.

The second movable electrode 220 includes the first movable electrode finger 221 positioned in the first opening 231 and supported by the second movable portion 223 and the second movable electrode finger 222 positioned in the second opening 232 and supported by the second movable portion 223.

The plurality of first movable electrode fingers 221 are provided apart from each other along the X-axis direction, and mesh with the plurality of first fixed electrode fingers 216 in a comb shape. Each first movable electrode finger 221 is positioned on the minus side in the X-axis direction with respect to the pair of first fixed electrode fingers 216, and faces the first fixed electrode finger 216 through a gap.

The plurality of second movable electrode fingers 222 are provided spaced apart from each other along the X-axis direction, and mesh with the plurality of second fixed electrode fingers 218 in a comb shape. Each second movable electrode finger 222 is positioned on the minus side in the X-axis direction with respect to the pair of second fixed electrode fingers 218, and faces the second fixed electrode finger 218 through a gap.

The inertial sensor 30 measures the acceleration Ax in the X-axis direction by detecting a change in the gap between the first fixed electrode finger 216 and the first movable electrode finger 221 of the second detection element 200 and a change in the gap between the second fixed electrode finger 218 and the second movable electrode finger 222, as a change in capacitance.

The fourth detection element 400 has a shape obtained by rotating the second detection element 200 by 90 degrees clockwise around the Z-axis, and measures the acceleration Ay in the Y-axis direction. As illustrated in FIG. 6, the fourth detection element 400 includes a fourth fixed portion 424 fixed to the second surface 42 of the substrate 40, a fourth fixed electrode 410 fixed to the fourth fixed portion 424, and a fourth movable portion 423 that is displaced with respect to the fourth fixed portion 424, a fourth spring portion 425 that connects the fourth fixed portion 424 and the fourth movable portion 423, and a fourth movable electrode 420 provided on the fourth movable portion 423.

The fourth fixed electrode 410 is configured by fixed electrodes 411 and 412. The fourth fixed portion 424 is configured by fixed portions 413, 414, and 426.

An outline of the fourth movable portion 423 is rectangular in a plan view from the Z-axis direction, and the fourth fixed portion 424, the fourth spring portion 425, and the fourth fixed electrode 410 are provided inside the outline. The fourth movable portion 423 includes a third opening 431 which is positioned on the minus side in the X-axis direction with respect to the fixed portion 426 and in which the fixed electrode 411 and a third movable electrode finger 421 are disposed inside thereof and a fourth opening 432 which is positioned on the plus side in the X-axis direction with respect to the fixed portion 426 and in which the fixed electrode 412 and a fourth movable electrode finger 422 are disposed inside thereof.

The fixed portion 413 is provided on the minus side in the X-axis with the fixed portion 426 as a reference. The fixed portion 414 is provided on the plus side in the X-axis with the fixed portion 426 as a reference.

The fixed electrode 411 is fixed to the fixed portion 413. The fixed electrode 411 includes a third trunk portion 415 supported by the fixed portion 413, and a plurality of third fixed electrode fingers 416 extending from the third trunk portion 415 to both sides in the X-axis direction. The plurality of third fixed electrode fingers 416 are provided apart from each other along the Y-axis direction.

The third trunk portion 415 has a rod shape, one end of which is coupled to the fixed portion 413, and the other end is a free end. The third trunk 415 extends along an axis Q3 inclined with respect to each of the X-axis and the Y-axis in a plan view from the Z-axis direction. The axis Q3 is inclined so that the distance from the central axis C2 increases toward the plus side in the Y-axis direction.

The fixed electrode 412 is fixed to the fixed portion 414. The fixed electrode 412 includes a fourth trunk portion 417 supported by the fixed portion 414 and a plurality of fourth fixed electrode fingers 418 extending from the fourth trunk portion 417 to both sides in the X-axis direction. The plurality of fourth fixed electrode fingers 418 are provided apart from each other along the Y-axis direction.

The fourth trunk portion 417 has a rod shape, one end of which is coupled to the fixed portion 414, and the other end is a free end. The fourth trunk portion 417 extends along an axis Q4 inclined with respect to each of the X-axis and the Y-axis in a plan view from the Z-axis direction. The axis Q4 is inclined so that the distance from the central axis C2 increases toward the plus side in the Y-axis direction.

The fourth movable electrode 420 includes the third movable electrode finger 421 positioned in the third opening 431 and supported by the fourth movable portion 423 and a fourth movable electrode finger 422 positioned in the fourth opening 432 and supported by the fourth movable portion 423.

The plurality of third movable electrode fingers 421 are provided apart from each other along the Y-axis direction, and mesh with the plurality of third fixed electrode fingers 416 in a comb shape. Each third movable electrode finger 421 is positioned on the minus side in the Y-axis direction with respect to the pair of third fixed electrode fingers 416 and faces the third fixed electrode finger 416 through a gap.

The plurality of fourth movable electrode fingers 422 are provided spaced apart from each other along the Y-axis direction, and mesh with the plurality of fourth fixed electrode fingers 418 in a comb shape. Each fourth movable electrode finger 422 is positioned on the minus side in the Y-axis direction with respect to the paired fourth fixed electrode finger 418 and faces the fourth fixed electrode finger 418 through a gap.

The inertial sensor 30 measures the acceleration Ay in the Y-axis direction by detecting a change in the gap between the third fixed electrode finger 416 and the third movable electrode finger 421 of the fourth detection element 400 and a change in the gap between the fourth fixed electrode finger 418 and the fourth movable electrode finger 422, as a change in capacitance.

The first detection element 100, the second detection element 200, the third detection element 300, and the fourth detection element 400 can be formed by patterning a silicon substrate doped with impurities such as phosphorus (P) and boron (B) by etching. However, the material of the elements is not particularly limited.

As illustrated in FIG. 7, the substrate 40 has a concave portion 66 that opens to the first surface 41 side in order to secure a space M1 in which the first movable portion 123 of the first detection element 100 can move. The substrate 40 has a concave portion 67 that opens to the second surface 42 side in order to secure a space M2 in which the second movable portion 223 of the second detection element 200 can move. Similarly, for the third movable portion 323 of the third detection element 300 and the fourth movable portion 423 of the fourth detection element 400, the first surface 41 and the second surface 42 of the substrate 40 are respectively provided with a concave portion as a space for movement, but are not illustrated and omitted.

As the substrate 40, a glass substrate made of a glass material containing alkali metal ions, for example, borosilicate glass such as Tempax (registered trademark) glass or Pyrex (registered trademark) glass can be used. With this configuration, the substrate 40 can be easily processed. Furthermore, the substrate 40, the first detection element 100, the second detection element 200, the third detection element 300, and the fourth detection element 400 can be bonded by anodic bonding, and these substrate and elements can be firmly bonded. However, the substrate 40 is not limited to a glass substrate, and for example, a silicon substrate or a ceramic substrate may be used.

That is, the inertial sensor 30 of this embodiment includes the substrate 40, the first detection element 100 which is provided on the first surface 41 of the substrate 40 and includes the first movable portion 123 displaceable with respect to the substrate 40 and the first fixed portion 124 which is connected to the first movable portion 123 and fixed to the substrate 40, and the second detection element 200 which is provided on the second surface 42, that is in the front-back relationship with the first surface 41, and includes the second movable portion 223 displaceable with respect to the substrate 40 and the second fixed portion 224 which is connected to the second movable portion 223 and fixed to the substrate 40.

As illustrated in FIG. 3, the first detection element 100 and the third detection element 300 are provided at line-symmetric positions with respect to a line L1 that is parallel to the first surface 41 of the substrate 40 and passes through an intersection point O of the diagonal lines of the first surface 41 of the substrate 40.

That is, the inertial sensor 30 of this embodiment includes the third detection element 300 which is provided on the first surface 41 and includes the third movable portion 323 displaceable with respect to the substrate 40 and the third fixed portion 324 which is connected to the third movable portion 323 and fixed to the substrate 40, and in a plan view of the substrate 40, when the substrate 40 is rectangular, the first detection element 100 and the third detection element 300 are provided at positions that are parallel to the first surface 41 and line-symmetric with respect to the line L1 that passes through the intersection point O of the diagonal lines of the substrate 40.

Figure 8:
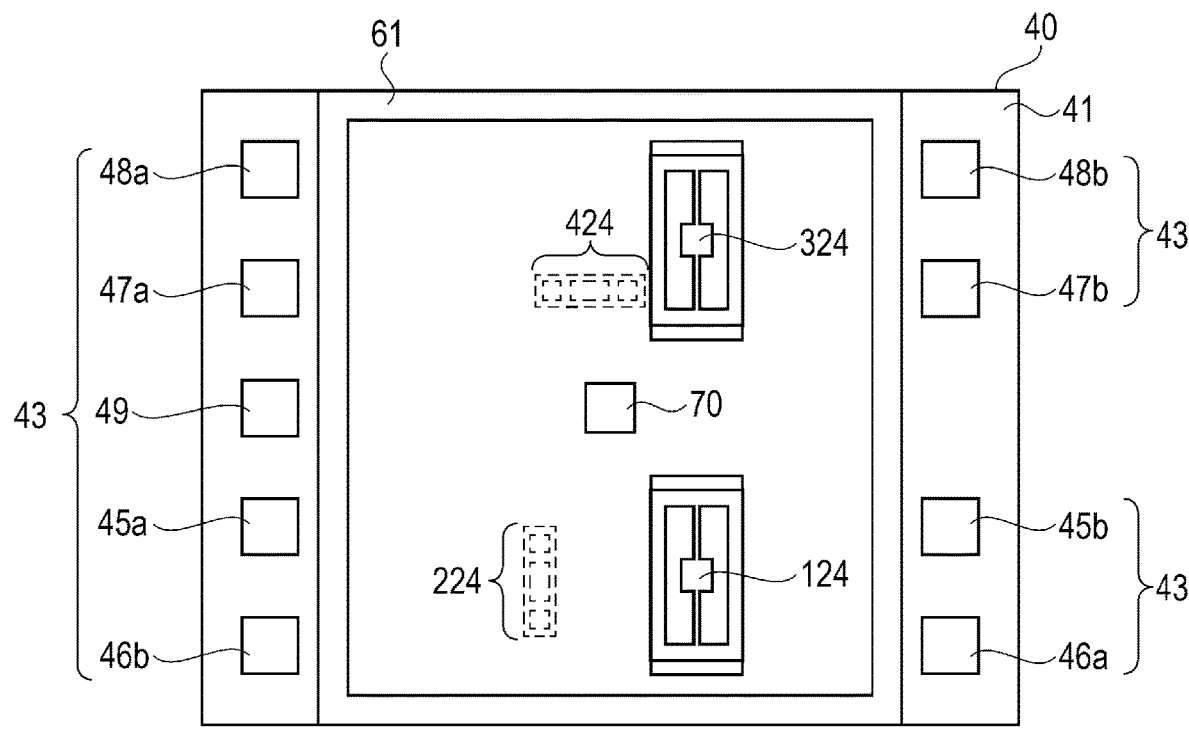
FIG. 8 is a plan view in which a first to fourth fixed portions illustrated in FIGS. 5 and 6 are schematically overlapped with the first surface of the substrate.
Figure 8:
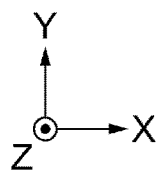

FIG. 8 is a plan view in which the first fixed portion 124, the second fixed portion 224, the third fixed portion 324, and the fourth fixed portion 424 illustrated in FIGS. 5 and 6 are schematically overlapped with the first surface 41 of the substrate 40. Here, for simplification, the plurality of first wirings 53 are not illustrated.

As illustrated in FIG. 8, the first fixed portion 124 of the first detection element 100 and the third fixed portion 324 of the third detection element 300 are provided at positions where the first and second fixed portions do not overlap the second fixed portion 224 of the second detection element 200 and the fourth fixed portion 424 of the fourth detection element 400.

That is, the first fixed portion 124 and the second fixed portion 224 are provided at positions where the first and second fixed portions do not overlap, in a plan view of the substrate 40.

As can be seen with reference to FIGS. 1 and 3, the first lid body 61 of the inertial sensor 30 has a concave portion 62 that opens to the lower surface side, and is bonded to the first surface 41 of the substrate 40 so that the first detection element 100 and the third detection element 300 are accommodated in the concave portion 62. A first space S1 in which the first detection element 100 and the third detection element 300 are hermetically accommodated is formed by the first lid body 61 and the substrate 40. Furthermore, the first lid body 61 has a first hole 60 hermetically sealed with a sealing material 63.

As can be seen with reference to FIGS. 1 and 4, the second lid body 64 has a concave portion 65 that opens to the upper surface side, and is bonded to the second surface 42 of the substrate 40 so that the second detection element 200 and the fourth detection element 400 are accommodated in the concave portion 65. A second space S2 in which the second detection element 200 and the fourth detection element 400 are hermetically accommodated is formed by the second lid body 64 and the substrate 40. Furthermore, the surface on the minus side of the Z-axis of the second lid body 64 is bonded to the bottom surface 29 in contact with the accommodation space S0 of the casing 10 through the first adhesive layer 27.

The first lid body 61 and the second lid body 64 are made of a silicon substrate, and are bonded to the substrate 40 through a glass frit. However, the constituent materials of the first lid body 61 and the second lid body 64 and the bonding method between the first lid body 61 and the second lid body 64 and the substrate 40 are not particularly limited.

Figure 9:
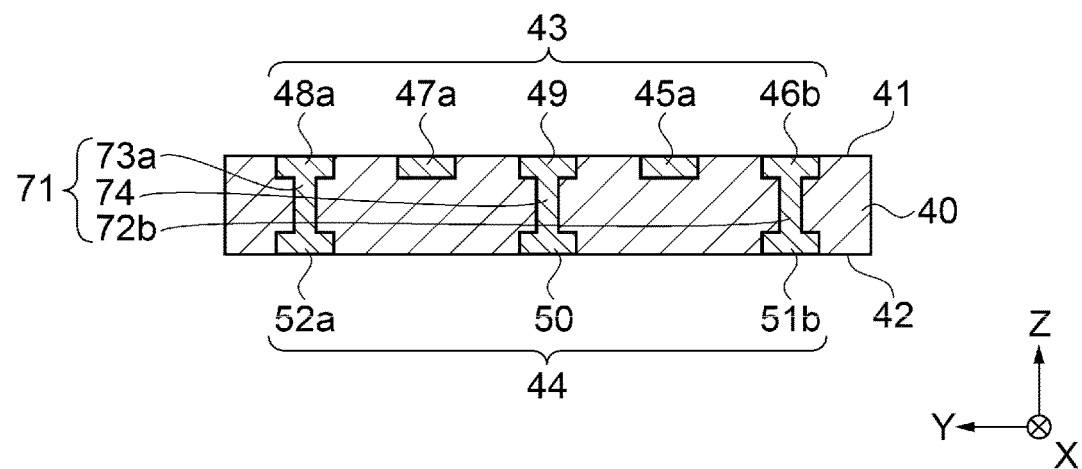
FIG. 9 is a cross-sectional view taken along line IX-IX' illustrated in FIG. 3.
Figure 10:
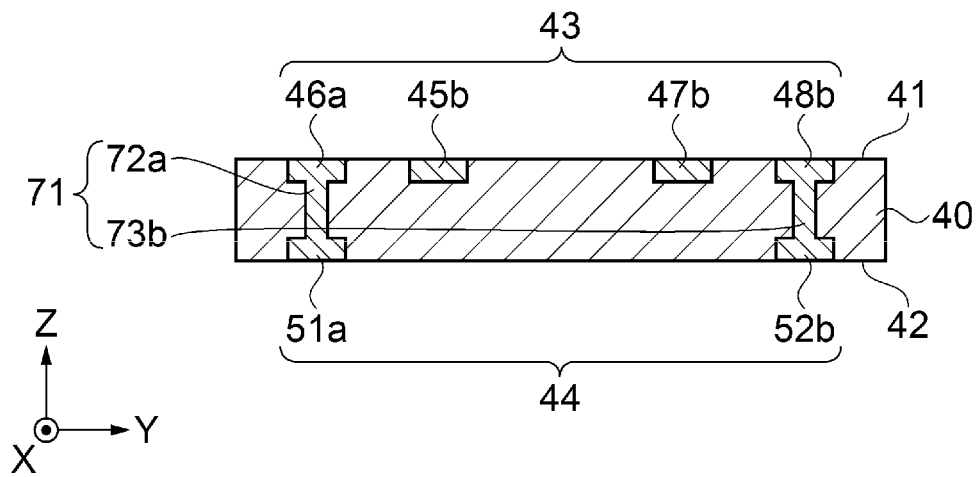
FIG. 10 is a cross-sectional view taken along line X-X' illustrated in FIG. 3.

FIG. 9 is a cross-sectional view taken along line IX-IX' illustrated in FIG. 3. FIG. 10 is a cross-sectional view taken along line X-X' illustrated in FIG. 3.

As illustrated in FIG. 1, FIG. 3, or FIG. 4, the substrate 40 includes a second hole 70, a plurality of first terminals 43, a plurality of second terminals 44, and a plurality of first wirings 53, and a plurality of second wirings 54. As illustrated in FIGS. 9 and 10, the substrate 40 includes a plurality of penetrating electrodes 71.

As illustrated in FIG. 1, the second hole 70 couples the first space S1 and the second space S2 in a state where the first lid body 61 and the second lid body 64 are bonded to the substrate 40.

That is, the inertial sensor 30 of this embodiment includes the first lid body 61 with which the first space S1 sealed with the first surface 41 is configured and the second lid body 64 with which the second space S2 sealed with the second surface 42 is configured, and in the inertial sensor 30, the first detection element 100 is accommodated in the first space S1, the second detection element 200 is accommodated in the second space S2, the first lid body 61 is provided with the first hole 60 sealed with a sealing material 63, and the substrate 40 is provided with the second hole 70 for communicating the first space S1 and the second space S2.

As illustrated in FIG. 3, the second hole 70 is provided at a position overlapping the intersection point O of the diagonals line of the first surface 41 of the substrate 40. As illustrated in FIG. 4, the second hole 70 is provided at a position overlapping the intersection point O of the diagonal lines of the second surface 42 of the substrate 40.

That is, in a plan view of the substrate 40, when the substrate 40 is rectangular, the second hole 70 is provided at a position overlapping the intersection point O of the diagonal lines of the substrate 40.

As illustrated in FIG. 3, the second hole 70 is provided at a position at which the second hole 70 is independent of the first detection element 100 and the third detection element 300 and does not overlap the first and third detection elements. As illustrated in FIG. 4, the second hole 70 is provided at a position at which the second hole 70 is independent of the second detection element 200 and the fourth detection element 400 and does not overlap the second and fourth detection elements.

That is, the second hole 70 is provided at a position where the second hole 70 does not overlap the first detection element 100 in a plan view of the substrate 40.

As illustrated in FIG. 3, the plurality of first terminals 43 are disposed on the first surface 41 of the substrate 40 and provided outside the first space S1 accommodated by the first lid body 61. The plurality of first terminals 43 are configured by terminals 45a, 45b, 46a, 46b, 47a, 47b, 48a, 48b, and 49.

As illustrated in FIG. 3, the plurality of first wirings 53 are disposed on the first surface 41 of the substrate 40. The plurality of first wirings 53 is configured by wirings 81a, 81b, 82a, 82b, 83a, 83b, and 83c.

The terminal 45a is electrically coupled to the fixed electrode 111 of the first detection element 100 through the wiring 81a. The terminal 45b is electrically coupled to the fixed electrode 112 of the first detection element 100 through the wiring 81b. The terminal 45a and the terminal 45b are disposed so as to sandwich the first lid body 61 therebetween.

The terminal 47a is electrically coupled to the fixed electrode 311 of the third detection element 300 through the wiring 82a. The terminal 47b is electrically coupled to the fixed electrode 312 of the third detection element 300 through the wiring 82b. The terminal 47a and the terminal 47b are disposed so as to sandwich the first lid body 61 therebetween.

The terminal 49 is electrically coupled to the first fixed portion 124 of the first detection element 100 through the wirings 83a and 83b. The first movable electrode 120, the first fixed portion 124, and the first movable portion 123 of the first detection element 100 are made of the same material and are integrally formed. That is, the terminal 49 is electrically coupled to the first movable electrode 120 of the first detection element 100.

The terminal 49 is electrically coupled to the third fixed portion 324 of the third detection element 300 through the wirings 83a and 83c. The third movable electrode 320, the third fixed portion 324, and the third movable portion 323 of the third detection element 300 are made of the same material and are integrally formed. That is, the terminal 49 is electrically coupled to the third movable electrode 320 of the third detection element 300.

The wiring 83a is branched into the wiring 83b and the wiring 83c on the first surface 41 of the substrate 40 facing the first space S1.

The terminal 46a and the terminal 46b are disposed so as to sandwich the first lid body 61 therebetween.

The terminal 48a and the terminal 48b are disposed so as to sandwich the first lid body 61 therebetween.

That is, in the inertial sensor 30 of this embodiment, the first lid body 61 is disposed between one terminal 45a of the plurality of first terminals 43 and the terminal 45b different from the one terminal 45a.

As illustrated in FIG. 1 or FIG. 4, the plurality of second terminals 44 are disposed on the second surface 42 of the substrate 40 and provided in the second space S2 accommodated by the second lid body 64. As illustrated in FIG. 4, the plurality of second terminals 44 are configured by terminals 50, 51a, 51b, 52a, and 52b.

As illustrated in FIG. 4, the plurality of second wirings 54 are disposed on the second surface 42 of the substrate 40 and are provided in the second space S2 accommodated by the second lid body 64. The plurality of second wirings 54 are configured by wirings 84a, 84b, 85a, 85b, 86a, 86b, and 86c.

The terminal 51a is electrically coupled to the fixed electrode 211 of the second detection element 200 through the wiring 84a. The terminal 51b is electrically coupled to the fixed electrode 212 of the second detection element 200 through the wiring 84b.

The terminal 52a is electrically coupled to the fixed electrode 411 of the fourth detection element 400 through the wiring 85a. The terminal 52b is electrically coupled to the fixed electrode 412 of the fourth detection element 400 through the wiring 85b.

The terminal 50 is electrically coupled to the fixed portion 226 of the second detection element 200 through the wirings 86a and 86b. The second movable electrode 220, the fixed portion 226, and the second movable portion 223 of the second detection element 200 are made of the same material and are integrally formed. That is, the terminal 50 is electrically coupled to the second movable electrode 220 of the second detection element 200.

The terminal 50 is electrically coupled to the fixed portion 426 of the fourth detection element 400 through the wirings 86a and 86c. The fourth movable electrode 420, the fixed portion 426, and the fourth movable portion 423 of the fourth detection element 400 are made of the same material and are integrally formed. That is, the terminal 50 is electrically coupled to the fourth movable electrode 420 of the fourth detection element 400.

The wiring 86a branches into the wiring 86b and the wiring 86c on the second surface 42 of the substrate 40 facing the second space S2.

As illustrated in FIG. 9 or FIG. 10, the plurality of penetrating electrodes 71 are configured by penetrating electrodes 72a, 72b, 73a, 73b, and 74.

As illustrated in FIG. 10, the penetrating electrode 72a is provided so as to penetrate from the first surface 41 of the substrate 40 to the second surface 42, and electrically couples the terminal 46a and the terminal 51a. That is, the terminal 46a is electrically coupled to the fixed electrode 211 of the second detection element 200.

As illustrated in FIG. 9, the penetrating electrode 72b is provided so as to penetrate from the first surface 41 of the substrate 40 to the second surface 42, and electrically couples the terminal 46b and the terminal 51b. That is, the terminal 46b is electrically coupled to the fixed electrode 212 of the second detection element 200.

As illustrated in FIG. 9, the penetrating electrode 73a is provided so as to penetrate from the first surface 41 of the substrate 40 to the second surface 42, and electrically couples the terminal 48a and the terminal 52a. That is, the terminal 48a is electrically coupled to the fixed electrode 411 of the fourth detection element 400.

As illustrated in FIG. 10, the penetrating electrode 73b is provided so as to penetrate from the first surface 41 of the substrate 40 to the second surface 42, and electrically couples the terminal 48b and the terminal 52b. That is, the terminal 48b is electrically coupled to the fixed electrode 412 of the fourth detection element 400.

As illustrated in FIG. 9, the penetrating electrode 74 is provided so as to penetrate from the first surface 41 of the substrate 40 to the second surface 42, and electrically couples the terminal 49 and the terminal 50. That is, the terminal 49 is electrically coupled to the first movable electrode 120 of the first detection element 100, the second movable electrode 220 of the second detection element 200, the third movable electrode 320 of the third detection element 300, and the fourth movable electrode 420 of the fourth detection element 400.

That is, the inertial sensor 30 of this embodiment incudes a plurality of first terminals 43 provided on the first surface 41 and outside the first space S1, a plurality of second terminals 44 provided on the second surface 42 and in the second space S2, and a plurality of penetrating electrodes 71 provided on the substrate 40 and electrically coupling the first terminal of any one of the plurality of first terminals 43 and the second terminal of any one of the plurality of second terminals 44, and in the inertial sensor 30, the first terminal of any one of the plurality of first terminals 43 is electrically coupled to the first detection element 100 and the second terminal of any one of the plurality of second terminals 44 is electrically coupled to the second detection element 200.

FIGS. 11A to 11L are process flow diagrams illustrating manufacturing steps of the inertial sensor 30 illustrated in FIG. 1. FIGS. 11F to 11L are illustrated upside down with respect to FIGS. 11A to 11E.

Examples of the method for manufacturing the inertial sensor 30 includes, for example, the method illustrated in FIGS. 11A to 11L. For the sake of simplicity, in FIGS. 11A to 11L, the first detection element 100 and the second detection element 200 has a substantially rectangular parallelepiped shape. The substrate 40 configured by a glass substrate, and the first detection element 100, the second detection element 200, the first lid body 61, and the second lid body 64 are configured by a silicon substrate. For simplification, the third detection element 300 and the fourth detection element 400 are omitted.

Figure 11A:
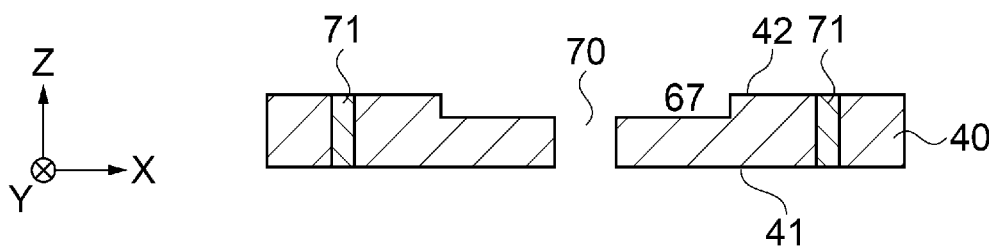
FIG. 11A is a process flow diagram illustrating a manufacturing process of the inertial sensor illustrated in FIG. 1.

First, as illustrated in FIG. 11A, the plurality of penetrating electrodes 71 are formed so as to penetrate from the second surface 42 to the first surface 41 of the wafer-shaped substrate 40 by laser processing, plating, etching, or the like. The concave portion 67 and the second hole 70 are formed in the second surface 42 of the substrate 40 such that the second hole 70 penetrates from the second surface 42 to the first surface 41 of the substrate 40 by etching or the like.

Figure 11B:
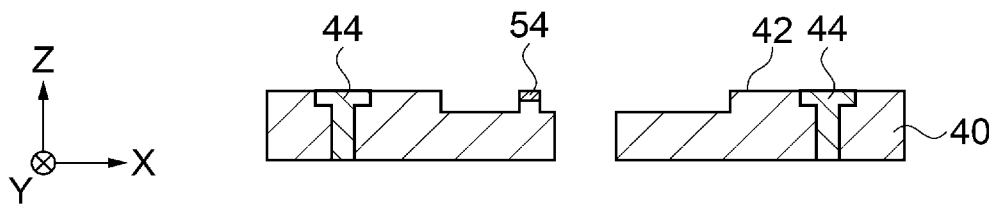
FIG. 11B is a process flow diagram illustrating the manufacturing process of the inertial sensor illustrated in FIG. 1.

Next, as illustrated in FIG. 11B, the plurality of second terminals 44 and the plurality of second wirings 54 are formed on the second surface 42 of the substrate 40 by chemical vapor deposition (CVD), physical vapor deposition (PVD), or the like.

Figure 11C:
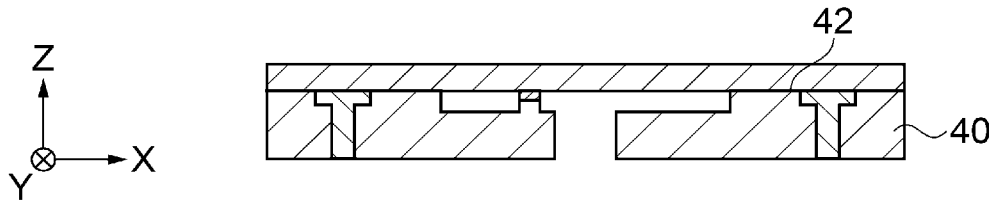
FIG. 11C is a process flow diagram illustrating the manufacturing process of the inertial sensor illustrated in FIG. 1.

Next, as illustrated in FIG. 11C, a wafer-shaped silicon substrate constituting the second detection element 200 is bonded to the second surface 42 of the substrate 40 by anodic bonding, plasma bonding, or the like.

Figure 11D:
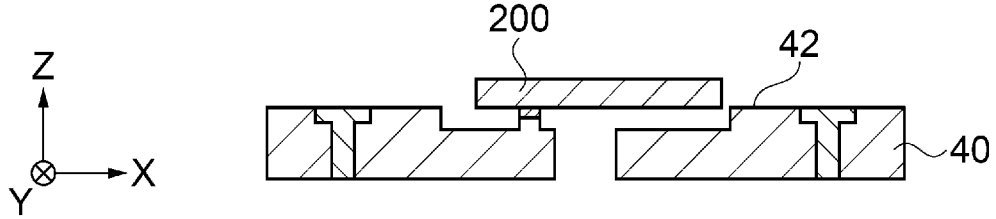
FIG. 11D is a process flow diagram illustrating the manufacturing process of the inertial sensor illustrated in FIG. 1.

Next, as illustrated in FIG. 11D, the bonded silicon substrate is patterned by etching or the like to form the second detection element 200.

Figure 11E:
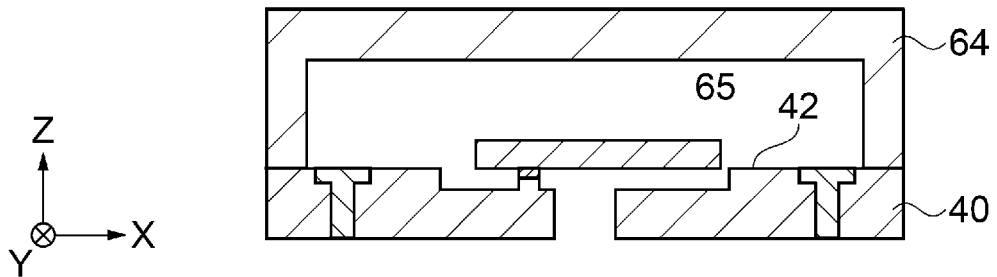
FIG. 11E is a process flow diagram illustrating the manufacturing process of the inertial sensor illustrated in FIG. 1.

Next, as illustrated in FIG. 11E, the wafer-shaped silicon substrate in which the concave portion 65 of the second lid body 64 is formed by etching or the like and the second surface 42 of the substrate 40 are bonded to each other by glass frit bonding, plasma bonding, or the like.

Figure 11F:
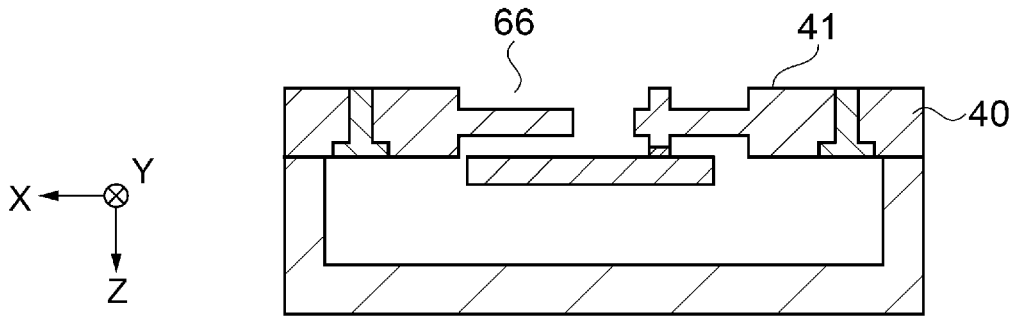
FIG. 11F is a process flow diagram illustrating the manufacturing process of the inertial sensor illustrated in FIG. 1.

Next, as illustrated in FIG. 11F, the concave portion 66 is formed in the first surface 41 of the substrate 40 by etching or the like.

Figure 11G:
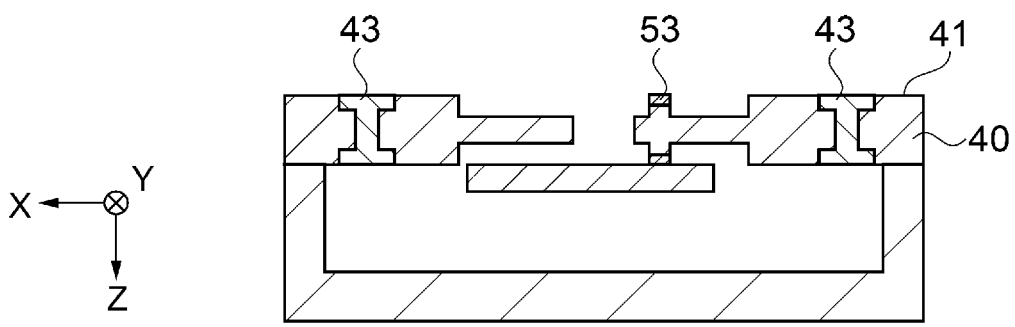
FIG. 11G is a process flow diagram illustrating the manufacturing process of the inertial sensor illustrated in FIG. 1.

Next, as illustrated in FIG. 11G, the plurality of first terminals 43 and the plurality of first wirings 53 are formed on the first surface 41 of the substrate 40 by the CVD, PVD, or the like.

Figure 11H:
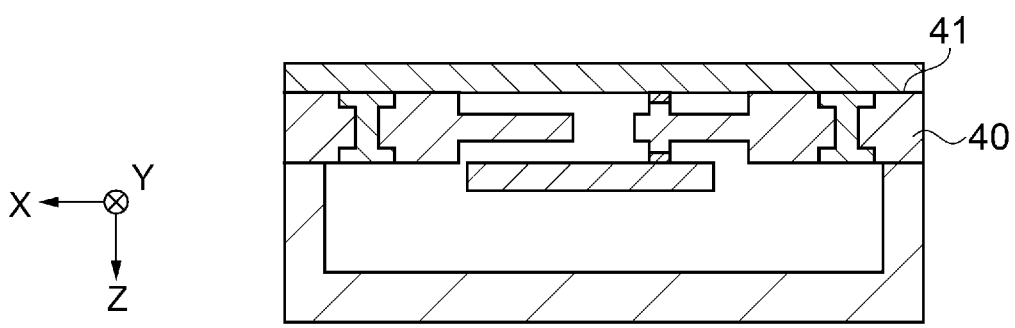
FIG. 11H is a process flow diagram illustrating the manufacturing process of the inertial sensor illustrated in FIG. 1.

Next, as illustrated in FIG. 11H, the silicon substrate constituting the first detection element 100 is bonded to the first surface 41 of the substrate 40 by anodic bonding, plasma bonding, or the like.

Figure 11I:
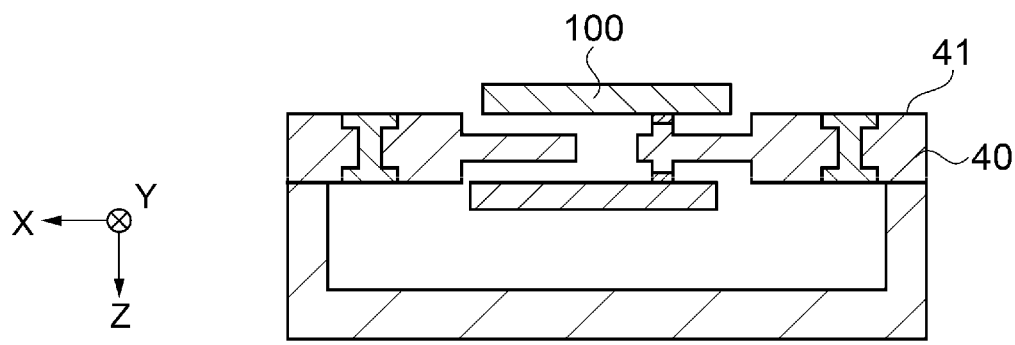
FIG. 11I is a process flow diagram illustrating the manufacturing process of the inertial sensor illustrated in FIG. 1.

Next, as illustrated in FIG. 11I, the bonded silicon substrate is patterned by etching or the like to form the first detection element 100.

Figure 11J:
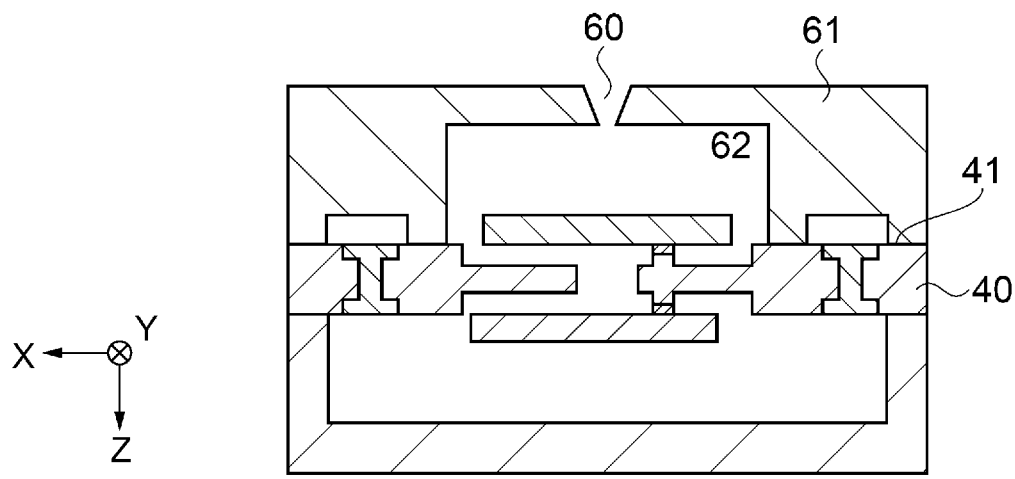
FIG. 11J is a process flow diagram illustrating the manufacturing process of the inertial sensor illustrated in FIG. 1.

Next, as illustrated in FIG. 11J, the wafer-shaped silicon substrate, in which the concave portion 62 and the first hole 60 of the first lid body 61 are formed by etching or the like, and the first surface 41 of the substrate 40 are bonded by glass frit bonding, plasma bonding, or the like.

Figure 11K:
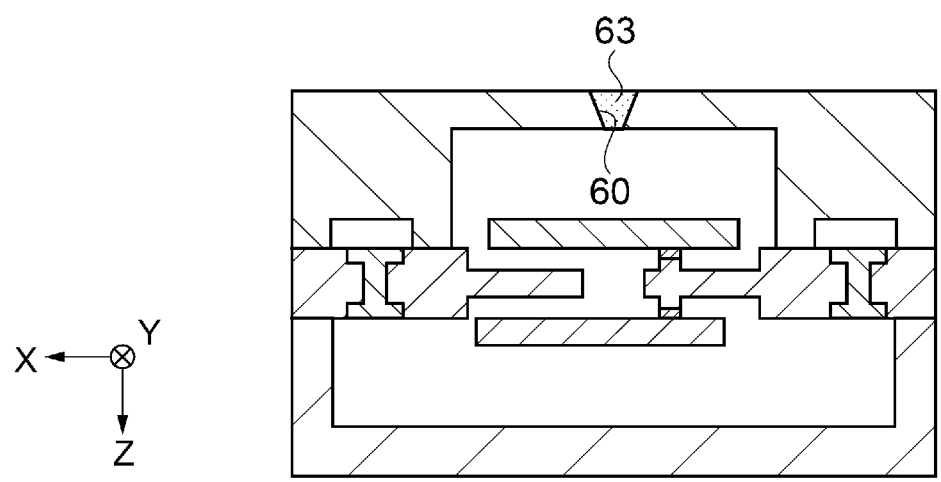
FIG. 11K is a process flow diagram illustrating the manufacturing process of the inertial sensor illustrated in FIG. 1.

Next, as illustrated in FIG. 11K, the first hole 60 is filled with a sealing material 63 made of a material that can be melted by laser and is represented by AuGe, and is hermetically sealed with arbitrary gas and pressure by laser irradiation or the like.

Figure 11L:
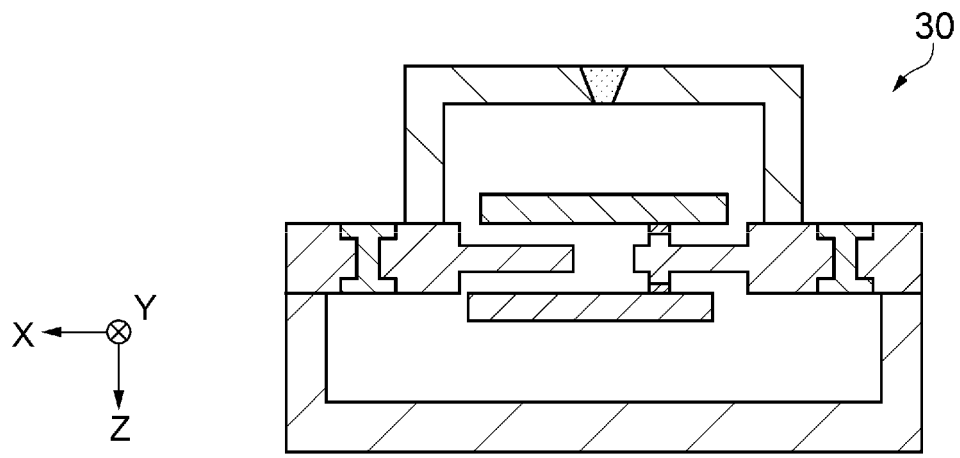
FIG. 11L is a process flow diagram illustrating manufacturing steps of the inertial sensor illustrated in FIG. 1.

Next, as illustrated in FIG. 11L, the inertial sensor 30 is cut out from the wafer-shaped bonded substrate by blade dicing, stealth dicing, or the like.

As described above, according to the inertial sensor according to this embodiment, the following effects can be obtained.

By forming the first detection element 100 and the third detection element 300 on the first surface 41 of the substrate 40 and forming the second detection element 200 and the fourth detection element 400 on the second surface 42 of the substrate 40, the number of detection elements formed on the first surface 41 is reduced compared to the case where second detection elements 200 and the fourth detection element 400 are formed on the first surface 41. With this configuration, the area of the XY plane of the substrate 40 can be reduced, and thus miniaturization of the inertial sensor can be realized.

By forming the second hole 70 in the substrate 40, the first space S1 and the second space S2 can be hermetically sealed together by the first lid body 61 compared to the case where the second hole 70 is not formed. With this configuration, the hermetic sealing with the second lid body 64 can be omitted, and thus the manufacturing process can be simplified.

By providing the second hole 70 at a position where the second hole 70 does not overlap the first detection element 100 and the third detection element 300 in a plan view of the substrate 40, it is possible to suppress reduction in the area of the first fixed electrode 110 and the third fixed electrode 310 compared to the case where the second hole is provided at a position where the second hole overlaps the first and third detection elements. With this configuration, the area of the first fixed electrode 110 facing the first movable electrode 120 and the area of the third fixed electrode 310 facing the third movable electrode 320 do not decrease, and thus capacitance to be measured does not decrease. Accordingly, detection sensitivity of the inertial sensor can be maintained.

Furthermore, by providing the second hole 70 at a position where the second hole 70 does not overlap the first detection element 100 and the third detection element 300 in a plan view of the substrate 40, airflow generated by the movement of the first movable portion 123 and the third movable portion 323 can be suppressed from flowing into the second space S2 through the second hole 70 compared to the case where the second hole is provided at a position where the second hole overlaps the first and third detection elements. With this configuration, the second movable portion 223 and the fourth movable portion 423 are hardly displaced by the airflow generated by the movement of the first movable portion 123 and the third movable portion 323, and desired detection accuracy can be exhibited. Accordingly, detection accuracy of the inertial sensor can be maintained.

By bonding the second lid body 64 to the second surface 42 of the substrate 40, the distance between the substrate 40 and the bottom surface 29 of the casing 10 is increased compared to the case where the second lid body 64 is not bonded to the second surface 42. More specifically, by adopting a configuration in which the second lid body 64 is bonded to the second surface 42 of the substrate 40 and the second lid body 64 is bonded to the bottom surface 29 of the casing 10, the distance between the substrate 40 and the bottom surface 29 of the casing 10 is increased compared to the case where a configuration in which the second detection element 200 and the fourth detection element 400 are not formed on the second surface 42, the second lid body 64 is not bonded to the second surface 42, and the second surface 42 is adhered to the bottom surface 29 of the casing 10 is adopted. With this configuration, the stress received from the bottom surface 29 of the casing 10 is hard to act on the substrate 40, and the distortion due to stress can be suppressed, and fluctuation in the gap between the fixed electrode and the movable electrode of each detection element due to distortion of the substrate 40 can be suppressed, and thus the signal output from the detection element is stabilized. Accordingly, an inertial sensor excellent in output stability can be realized.

By providing the first detection element 100 and the third detection element 300 at line-symmetric positions with respect to a line parallel to the first surface 41 of the substrate 40 and passing through an intersection point of diagonal lines of the substrate 40 in a plan view of the substrate 40, it is possible to reduce difference in fluctuation of the gap between the fixed electrode and the movable electrode of each detection element due to the distortion of the substrate 40 compared to the case where the first and third detection elements 100 and 300 are not provided at the line-symmetric positions. That is, when the substrate 40 is distorted around the axis of symmetry of line symmetry, the gap between the first fixed electrode 110 and the first movable electrode 120 of the first detection element 100, and the gap between the third fixed electrode 310 and the third movable electrode 320 of the third detection element 300 are substantially the same, and thus the signal output from the detection element is stabilized. Accordingly, in addition to the effects described above, an inertial sensor with more excellent output stability can be realized.

By disposing, on the first surface 41 of the substrate 40, the plurality of first terminals 43 at positions where the first lid body 61 is sandwiched therebetween, the stress received from the first lid body 61 accts on more evenly without being concentrated on a part of the substrate 40 compared to the case where the plurality of first terminals 43 are disposed at positions where the first lid body 61 is not sandwiched therebetween. With this configuration, deviation of distortion due to the stress can be suppressed in the substrate 40 and the difference in fluctuation of the gap between the fixed electrode and the movable electrode of each detection element due to the distortion of the substrate 40 can be reduced, and thus the signal output from the detection element is stabilized. Accordingly, in addition to the effects described above, an inertial sensor with more excellent output stability can be realized.

By providing the second hole 70 at a position where the second hole 70 overlaps the intersection point of the diagonal lines of the first surface 41 of the substrate 40 in a plan view of the substrate 40, the stress on the substrate 40 received from the first lid body 61, the second lid body 64, and the casing 10 acts on more evenly without being concentrated on a part of the substrate 40 compared to the case where the second hole is provided at the position where the second hole does not overlap the intersection point of the diagonal lines. With this configuration, deviation of distortion due to the stress can be suppressed in the substrate 40 and the difference in fluctuation of the gap between the fixed electrode and the movable electrode of each detection element due to the distortion of the substrate 40 can be reduced, and thus the signal output from the detection element is stabilized. Accordingly, in addition to the effects described above, an inertial sensor with more excellent output stability can be realized.

By forming the plurality of penetrating electrodes 71 on the substrate 40, the influence of the stress on the substrate 40 received from the first lid body 61, the second lid body 64, the casing 10, and the like can be mitigated by the plurality of penetrating electrodes 71 compared to the case where the plurality of penetrating electrodes 71 are not formed. That is, the plurality of penetrating electrodes 71 function as a buffer material, and the distortion of the substrate 40 caused by external stress can be suppressed. With this configuration, even when excessive stress acts on the substrate 40, the substrate 40 is hardly distorted, and fluctuation in the gap between the fixed electrode and the movable electrode of each detection element due to the distortion of the substrate 40 can be suppressed and thus the signal output from the detection element is stabilized. Accordingly, in addition to the effects described above, an inertial sensor with more excellent output stability can be realized.

By providing the first fixed portion 124 and the third fixed portion 324 and the second fixed portion 224 and the fourth fixed portion 424 are provided at positions where the first to fourth fixed portions do not overlap each other in a plan view of the substrate 40, the physical vibration generated by the movement of the first movable portion 123 and the third movable portion 323 is hardly transmitted to the second movable portion 223 and the fourth movable portion 423 through the substrate 40, and the second and fourth movable portions are hardly displaced by the vibration compared to the case where the first and third fixed portions and the second and fourth fixed portions are provided at positions where the first to fourth fixed portions overlap each other. With this configuration, even when the first movable portion 123 and the third movable portion 323 move excessively, the fluctuation in the gap between the fixed electrode and the movable electrode of the second movable portion 223 and the fourth movable portion 423 due to vibration can be suppressed, and thus the signal output from the detection element is stabilized. Accordingly, in addition to the effects described above, an inertial sensor with more excellent output stability can be realized.

By electrically coupling the plurality of first terminals 43 and the plurality of second terminals 44 through the plurality of penetrating electrodes 71, the signals detected by the second detection element 200 and the fourth detection element 400 can be output from the plurality of first terminals 43 compared to a case where the plurality of first and second terminals are not electrically coupled. With this configuration, all the signals output from the inertial sensor 30 can be acquired by electrically coupling the plurality of first terminals 43 and the second connection terminals 22 of the IC 20 with the second wires 24, and thus electrical connection is easy.

Embodiment 2

Figure 12:
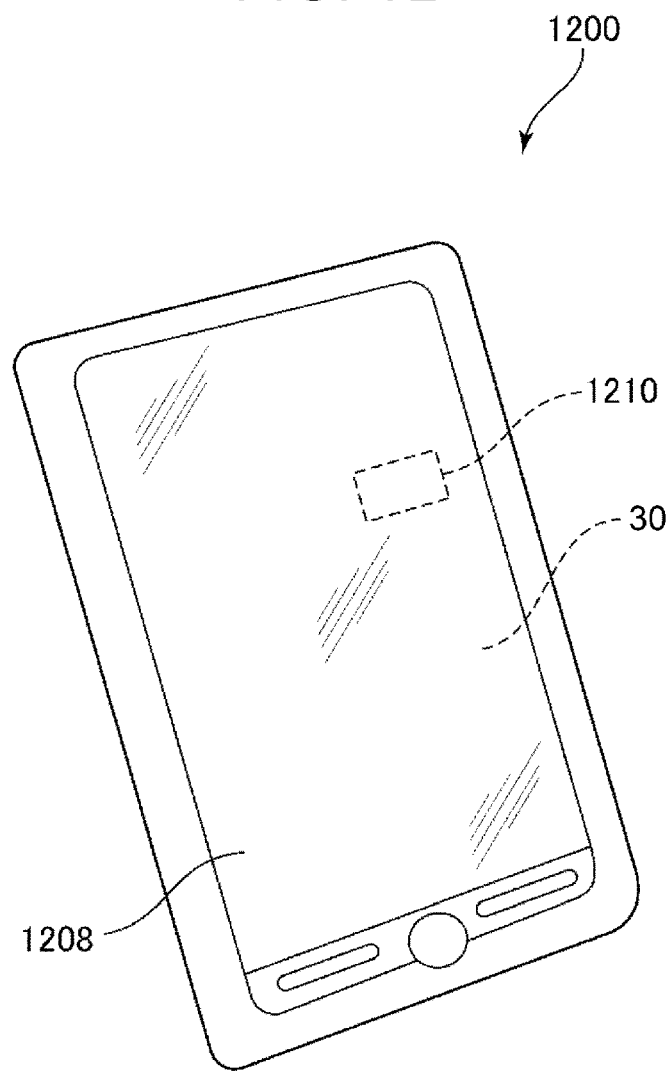
FIG. 12 is a plan view illustrating a smartphone as an electronic device according to Embodiment 2.

FIG. 12 is a plan view illustrating a smartphone 1200 as an electronic device according to Embodiment 2.

In the smartphone 1200 as the electronic device, the inertial sensor 30 and a control circuit 1210 as a processing unit that performs control based on detection signals output from the inertial sensor 30 are incorporated. Detection data measured by the inertial sensor 30 is transmitted to the control circuit 1210, and the control circuit 1210 can recognize the attitude and behavior of the smartphone 1200 from the received detection data, change a display image displayed on a display unit 1208, generate an alarm sound or sound effect, or drive the vibration motor to vibrate the main body.

That is, the smartphone 1200 as the electronic device includes the inertial sensor 30 and a processing unit that processes an output from the inertial sensor 30.

As described above, according to the electronic device according to this embodiment, the following effects can be obtained.

Since the smartphone 1200 as the electronic device includes the inertial sensor 30, the effect of the inertial sensor 30 described above can be obtained. That is, by including the inertial sensor 30 that is reduced in size, for example, miniaturization of the electronic device can be realized by reducing the area of the smartphone 1200, or the performance can be improved by adding other elements to the increased accommodation space.

In addition to the smartphone 1200 described above, the electronic device of the present disclosure can be applied to, for example, a personal computer, a digital still camera, a tablet terminal, a clock, a smart watch, an ink jet printer, a laptop personal computer, a TV, a wearable terminals such as HMD (head mounted display), a video camera, a video tape recorder, a car navigation device, a pager, an electronic datebook, an electronic dictionary, a calculator, an electronic game machines, a word processor, a work station, a videophone, a security TV monitor, an electronic binoculars, a POS terminal, medical equipment, a fish finder, various measuring instruments, mobile terminal base station equipment, various instruments of vehicles, aircraft, and ships, a flight simulator, a network server, and the like.

Embodiment 3

Figure 13:
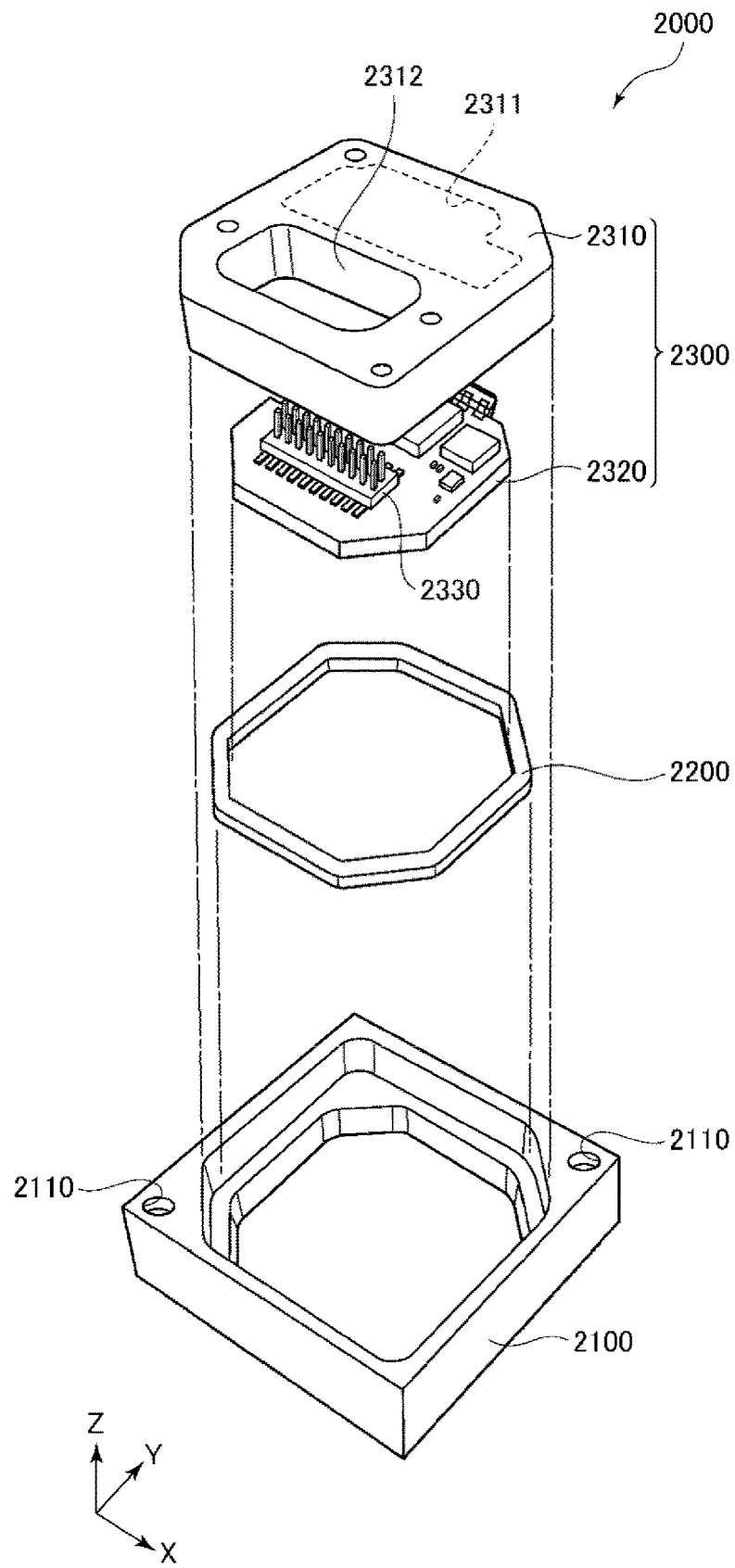
FIG. 13 is an exploded perspective view illustrating an inertial measurement unit as an electronic device according to Embodiment 3.
Figure 14:
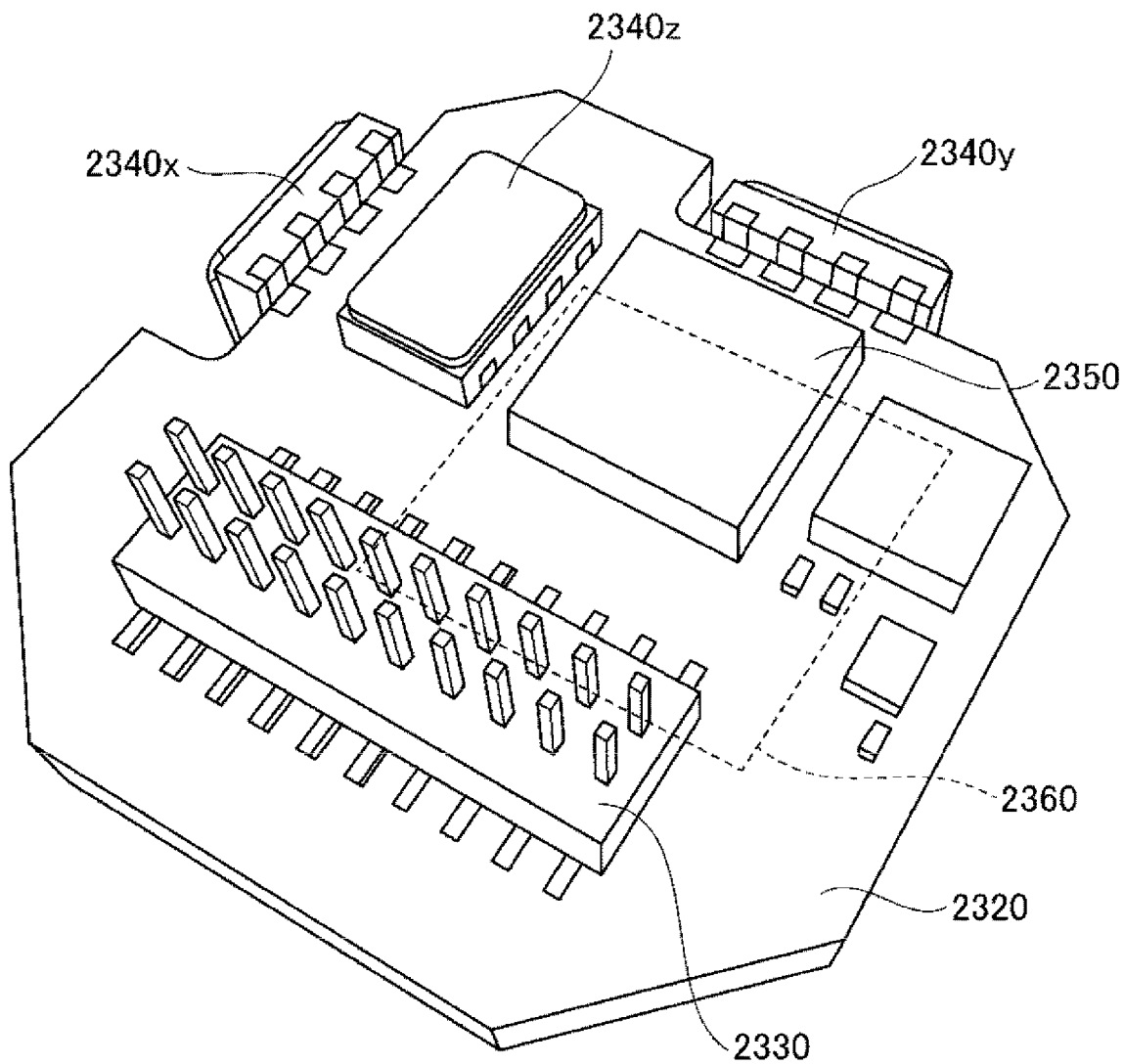
FIG. 14 is a perspective view of a substrate included in the inertial measurement unit illustrated in FIG. 13.

FIG. 13 is an exploded perspective view illustrating an inertial measurement unit 2000 as an electronic device according to Embodiment 3. FIG. 14 is a perspective view of a substrate included in the inertial measurement unit 2000 illustrated in FIG. 13.

The inertial measurement unit 2000 (IMU: Inertial measurement Unit) as the electronic device is an inertial measurement unit that detects the attitude and behavior of a mounted device such as an automobile or a robot. The inertial measurement unit 2000 functions as a six-axis motion sensor including three-axis acceleration sensors and three-axis angular velocity sensors.

The inertial measurement unit 2000 is a rectangular parallelepiped having a substantially square planar shape. Screw holes 2110 as fixed portions are formed in the vicinity of two vertices positioned in the diagonal direction of the square. Through two screws in the two screw holes 2110, the inertial measurement unit 2000 can be fixed to the mounted surface of the mounted object such as an automobile. The size of the inertial measurement unit 2000 can be reduced such that the device can be mounted on a smartphone or a digital camera, for example, by selection of parts or design change.

The inertial measurement unit 2000 has a configuration in which an outer case 2100, a bonding member 2200, and a sensor module 2300 are included and the sensor module 2300 is inserted in the outer case 2100 with the bonding member 2200 interposed therebetween. Similarly to the overall shape of the inertial measurement unit 2000 described above, the outer shape of the outer case 2100 is a rectangular parallelepiped having a substantially square planar shape, and screw holes 2110 are formed in the vicinity of two vertices positioned in the diagonal direction of the square. In addition, the outer case 2100 has a box shape and the sensor module 2300 is accommodated therein.

Further, the sensor module 2300 includes an inner case 2310 and a substrate 2320. The inner case 2310 is a member for supporting the substrate 2320, and has a shape that fits inside the outer case 2100. A concave portion 2311 for preventing contact with the substrate 2320 and an opening 2312 for exposing a connector 2330 described later are formed in the inner case 2310. Such an inner case 2310 is bonded to the outer case 2100 through the bonding member 2200. The substrate 2320 is bonded to the lower surface of the inner case 2310 through an adhesive.

As illustrated in FIG. 14, a connector 2330, an angular velocity sensor 2340z for measuring the angular velocity around the Z-axis, an acceleration sensor 2350 for measuring acceleration in each axis direction of the X-axis, the Y-axis, and the Z-axis and the like are mounted on the upper surface of the substrate 2320. An angular velocity sensor 2340x for measuring the angular velocity around the X-axis and an angular velocity sensor 2340y for measuring the angular velocity around the Y-axis are mounted on the side surface of the substrate 2320. As each of these sensors 2340x, 2340y, 2340z, and 2350, the inertial sensor 30 of the present specification can be applied.

A control IC 2360 as a processing unit that processes an output from each of the sensors 2340x, 2340y, 2340z, and 2350 is mounted on the lower surface of the substrate 2320. The control IC 2360 is a micro controller unit (MCU) and controls each unit of the inertial measurement unit 2000. In a storing unit, programs defining the order and contents for measuring the acceleration and angular velocity, programs for digitizing detected data and incorporating the detected data into packet data, accompanying data, and the like are stored. In addition, a plurality of electronic components are mounted on the substrate 2320.

As described above, according to the electronic device according to this embodiment, the following effects can be obtained.

Since the inertial measurement unit 2000 as the electronic device includes the inertial sensor 30, the effect of the inertial sensor 30 described above can be obtained. That is, by including the inertial sensor 30 that is reduced in size, for example, miniaturization of the inertial measurement unit 2000 can be realized by reducing the area, or the performance can be improved by adding other elements to the increased accommodation space.

Embodiment 4

Figure 15:
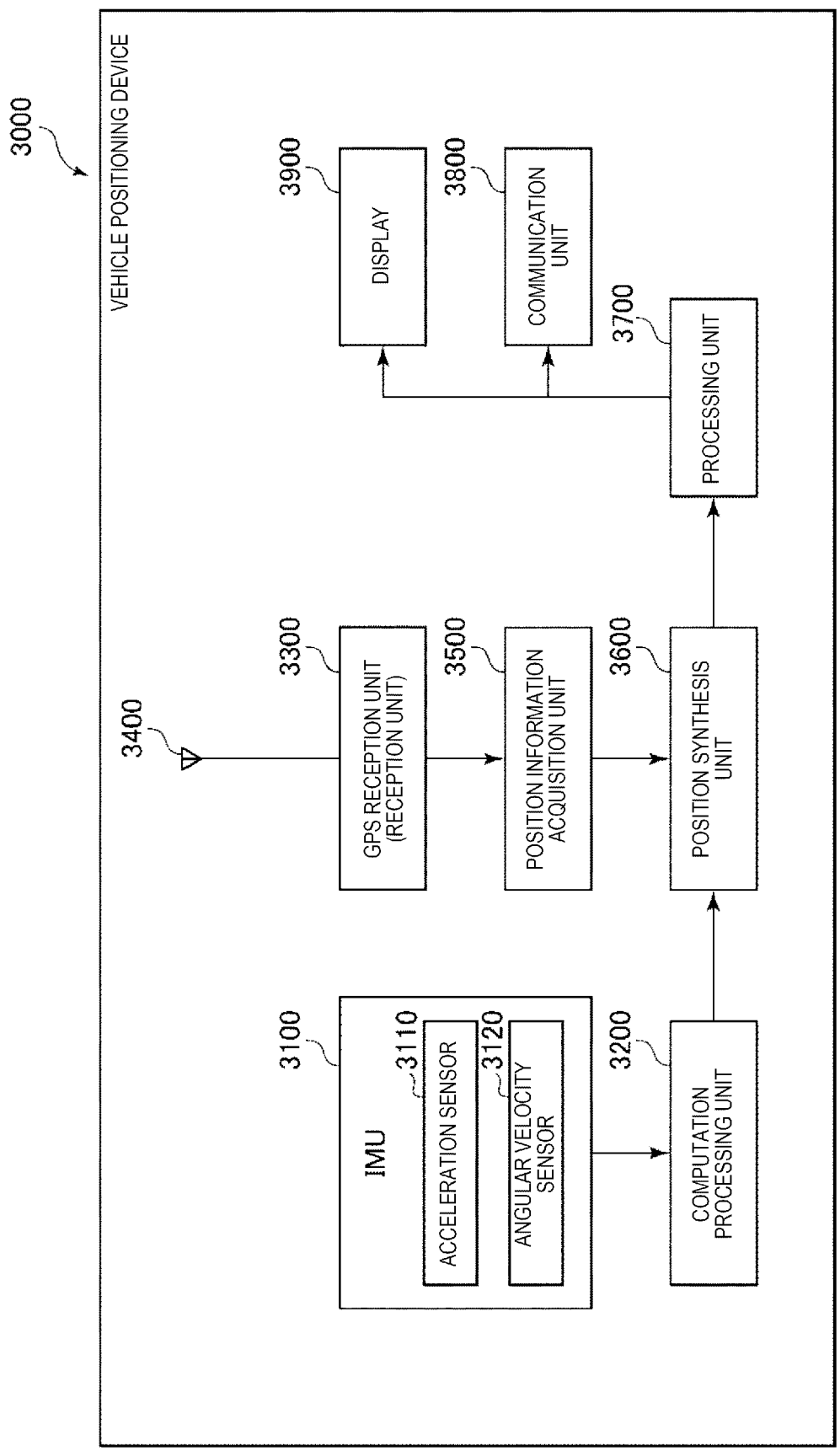
FIG. 15 is a block diagram illustrating an entire system of a vehicle positioning device as an electronic device according to Embodiment 4.
Figure 16:
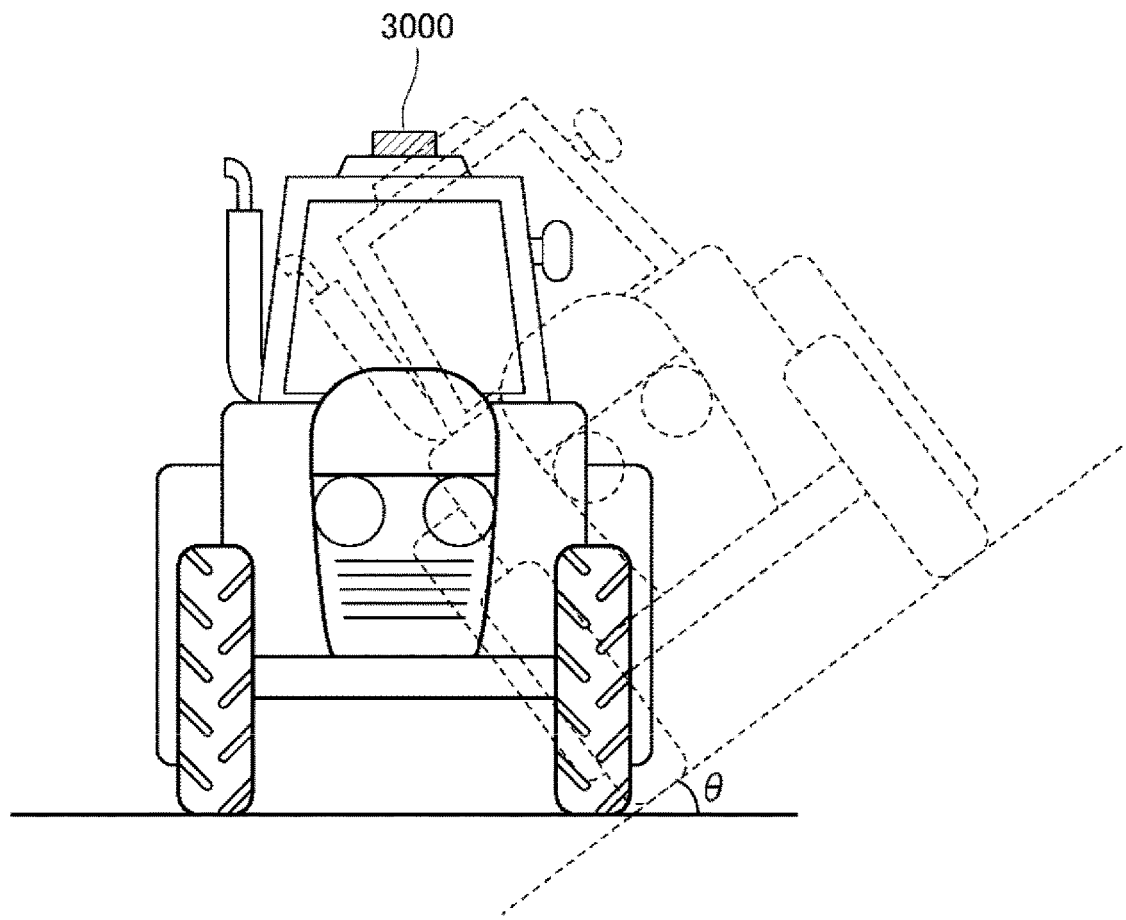
FIG. 16 is a diagram illustrating the operation of the vehicle positioning device illustrated in FIG. 15.

FIG. 15 is a block diagram illustrating the entire system of a vehicle positioning device 3000 as an electronic device according to Embodiment 4. FIG. 16 is a diagram illustrating the operation of the vehicle positioning device 3000 illustrated in FIG. 15.

The vehicle positioning device 3000 is a device which is used by being mounted on a vehicle and performs positioning of the vehicle. The vehicle is not particularly limited, and may be any of a bicycle, an automobile, a motorcycle, a train, an airplane, a ship, and the like, but in this embodiment, description will be made on a four-wheeled automobile as the vehicle.

The vehicle positioning device 3000 includes an inertial measurement unit 3100 (IMU), a computation processing unit 3200, a GPS reception unit 3300, a receiving antenna 3400, a position information acquisition unit 3500, a position synthesis unit 3600, a processing unit 3700, a communication unit 3800, and a display 3900.

The inertial measurement unit 3100 includes a tri-axis acceleration sensor 3110 and a tri-axis angular velocity sensor 3120. The computation processing unit 3200 receives acceleration data from the acceleration sensor 3110 and angular velocity data from the angular velocity sensor 3120, performs inertial navigation computation processing on these data, and outputs inertial navigation positioning data including acceleration and attitude of the vehicle. As the inertial measurement unit 3100, for example, the inertial measurement unit 2000 described above can be used. As the tri-axis acceleration sensor 3110 or the tri-axis angular velocity sensor 3120, the inertial sensor 30 of the present specification can be used.

The GPS reception unit 3300 receives a signal from the GPS satellite through the receiving antenna 3400. Further, the position information acquisition unit 3500 outputs GPS positioning data representing the position (latitude, longitude, altitude), speed, direction of the vehicle positioning device 3000 based on the signal received by the GPS reception unit 3300. The GPS positioning data also includes status data indicating a reception state, a reception time, and the like.

Based on inertial navigation positioning data output from the computation processing unit 3200 and the GPS positioning data output from the position information acquisition unit 3500, the position synthesis unit 3600 calculates the position of the vehicle, more specifically, the position on the ground where the vehicle is traveling. For example, even if the position of the vehicle included in the GPS positioning data is the same, as illustrated in FIG. 16, if the attitude of the vehicle is different due to the influence of inclination θ of the ground or the like, the vehicle is traveling at different positions on the ground. For that reason, it is impossible to calculate an accurate position of the vehicle with only GPS positioning data. Therefore, the position synthesis unit 3600 calculates the position on the ground where the vehicle is traveling, using inertial navigation positioning data.

The position data output from the position synthesis unit 3600 is subjected to predetermined processing by the processing unit 3700 and displayed on the display 3900 as a positioning result. Further, the position data may be transmitted to the external apparatus by the communication unit 3800.

Embodiment 5

Figure 17:
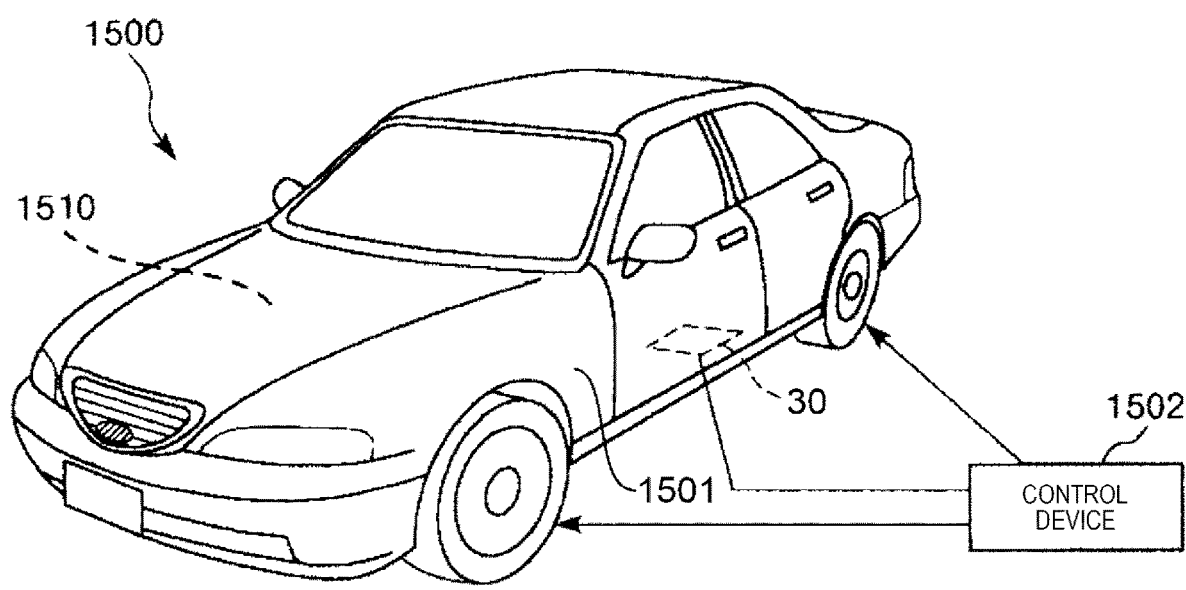
FIG. 17 is a perspective view illustrating an automobile as a vehicle according to the fifth embodiment.

FIG. 17 is a perspective view illustrating an automobile 1500 as the vehicle according to Embodiment 5.

The automobile 1500 illustrated in FIG. 17 is an automobile to which the vehicle described in this embodiment is applied. In this figure, the automobile 1500 includes at least one system 1510 of an engine system, a brake system, and a keyless entry system. The inertial sensor 30 is incorporated in the automobile 1500, and the attitude of a vehicle body 1501 can be measured by the inertial sensor 30. The detection signal of the inertial sensor 30 is supplied to a control device 1502 as the processing unit, and the control device 1502 can control the system 1510 based on the signal.

That is, the automobile 1500 as the vehicle includes the inertial sensor 30 and the processing unit that processes an output from the inertial sensor 30.

As described above, according to the vehicle according to this embodiment, the following effects can be obtained.

Since the automobile 1500 as the vehicle includes the inertial sensor 30, the effect of the inertial sensor 30 described above can be obtained. That is, by including the inertial sensor 30 that is reduced in size, for example, it is possible to improve the performance by adding other elements to the space in which the inertial sensor 30 is accommodated, or to reduce the vehicle body size or increase a vehicle compartment space.

The content of the present disclosure is not limited to the embodiments described above, and various alterations and improvements can be made to the embodiments described above. A modification example will be described below.

Modification Example 1

Figure 18:
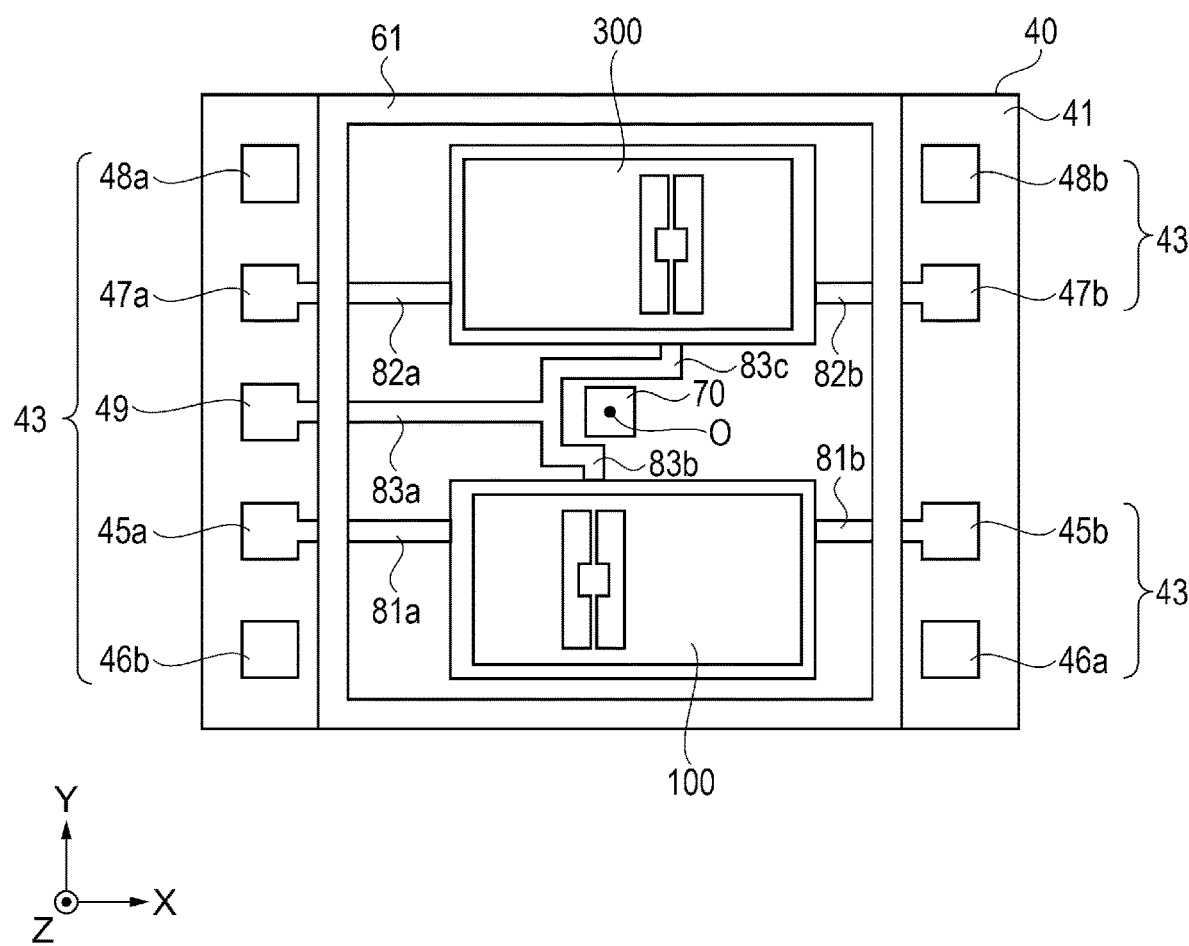
FIG. 18 is a plan view of a first surface of a substrate included in an inertial sensor according to Modification Example 1.

FIG. 18 is a plan view of the first surface 41 of the substrate 40 included in the inertial sensor 30 according to Modification Example 1.

Hereinafter, the inertial sensor 30 according to Modification Example 1 will be described. The same components as those in Embodiment 1 are denoted by the same reference numerals, and redundant description thereof is omitted.

In Embodiment 1 described above, as illustrated in FIG. 3, the first detection element 100 and the third detection element 300 are described as having a configuration in which the first and third detection elements 100 and 300 are provided at line-symmetric positions with respect to a line L1 that is parallel to the first surface 41 of the substrate 40 and passes through an intersection point O of the diagonal lines of the first surface 41 of the substrate 40, but is not limited to the configuration.

In the inertial sensor 30 according to this modification example, the first detection element 100 and the third detection element 300 are provided at point-symmetric positions with respect to the intersection point O of the diagonal lines of the first surface 41 of the substrate 40, as illustrated in FIG. 18.

That is, the inertial sensor 30 of this modification example includes the third detection element 300 which is provided on the first surface 41 and includes the third movable portion 323 displaceable with respect to the substrate 40 and the third fixed portion 324 which is connected to the third movable portion 323 and fixed to the substrate 40, and in a plan view of the substrate 40, when the substrate 40 is rectangular, the first detection element 100 and the third detection element 300 are provided at point-symmetric positions with respect to the intersection point O of the diagonal lines of the substrate 40.

As described above, according to the inertial sensor according to this modification example, the following effects can be obtained.

By providing the first detection element 100 and the third detection element 300 at point-symmetric positions with respect to the intersection point of the diagonal lines of the substrate 40 in a plan view of the substrate 40, the difference in fluctuation of the gap between the fixed electrode and the movable electrode of each detection element due to the distortion of the substrate 40 can be further reduced compared to the case where the first and third detection elements 100 and 300 are not provided at the point-symmetric positions. That is, when the substrate 40 is distorted around a symmetric point of point symmetry, the gap between the first fixed electrode 110 and the first movable electrode 120 of the first detection element 100 and the gap between the third fixed electrode 310 and the third movable electrode 320 of the third detection element 300 are substantially the same, and thus the signal output from the detection element is stabilized. Accordingly, in addition to the effects of Embodiment 1, an inertial sensor with more excellent output stability can be realized.

In addition, the inertial sensor module 1 described in Embodiment 1 can also be widely applied to a car navigation system, a car air conditioner, an anti-lock braking system (ABS), an air bag, a tire pressure monitoring system (TPMS), an engine controller, and an electronic control unit (ECU) such as a battery monitor of a hybrid car or an electric automobile. Also, the vehicle is not limited to the automobile 1500, but can also be applied to an airplane, a rocket, a satellite, a ship, an automated guided vehicle (AGV), a biped walking robot, an unmanned airplane such as a drone, and the like.

The inertial sensor, the electronic device, and the vehicle of the present disclosure have been described based on the embodiments, but is not limited thereto. The configuration of each unit can be replaced with any configuration having the same function. In addition, any other constituent elements may be added to the present disclosure. Further, the embodiments described above may be appropriately combined.

In the embodiments described above, although the acceleration sensor that measures acceleration is described as the inertial sensor, the inertial sensor is not limited to the acceleration sensor, and may be, for example, an angular velocity sensor or a combined sensor combining the acceleration sensor and the angular velocity sensor.

The contents derived from the embodiments will be described below.

The inertial sensor includes a substrate, a first detection element that is provided on a first surface of the substrate and includes a first movable portion displaceable with respect to the substrate and a first fixed portion connected to the first movable portion and fixed to the substrate, and a second detection element that is provided on a second surface in a front-back relationship with the first surface and includes a second movable portion displaceable with respect to the substrate and a second fixed portion connected to the second movable portion and fixed to the substrate.

According to this configuration, since the number of detection elements formed on the first surface of the substrate is reduced, the area of the XY plane of the substrate can be reduced. Accordingly, a miniaturizable inertial sensor can be provided.

The inertial sensor may include a first lid body that forms a first space with the first surface, and a second lid body that forms a second space with the second surface, and in which the first detection element may be accommodated in the first space, the second detection element may be accommodated in the second space, the first lid body may be provided with a first hole sealed with a sealing material, and the substrate may be provided with a second hole communicating the first space and the second space.

According to this configuration, since the distance between the bottom surface of the casing to which the inertial sensor is adhered and the substrate increases, stress received from the bottom surface of the casing hardly acts on the substrate, and distortion due to the stress can be suppressed. That is, since the fluctuation in the gap between the fixed electrode and the movable electrode of each detection element due to the distortion of the substrate can be suppressed, the signal output from the detection element is stabilized. Accordingly, an inertial sensor excellent in output stability can be provided.

Furthermore, according to this configuration, the first space and the second space can be hermetically sealed together by the first lid body. With this configuration, since hermetic sealing by the second lid body can be omitted, the manufacturing process can be simplified.

The inertial sensor may include a plurality of first terminals provided outside the first space on the first surface, a plurality of second terminals provided on the second surface and provided in the second space, and a penetrating electrode provided on the substrate and electrically coupling any one of the plurality of first terminals and any one of the plurality of second terminals, and in which any one of the plurality of first terminals may be electrically coupled to the first detection element, and any one of the plurality of second terminals may be electrically coupled to the second detection element.

According to this configuration, the influence of the stress on the substrate received from the first lid body, the second lid body, the casing, and the like can be mitigated by the plurality of penetrating electrodes. That is, the plurality of penetrating electrodes function as a buffer material, and the distortion of the substrate caused by external stress can be suppressed. With this configuration, even when excessive stress acts on the substrate, the substrate is hardly distorted, and the fluctuation in the gap between the fixed electrode and the movable electrode of each detection element due to the distortion of the substrate can be suppressed, and thus the signal output from the detection element is stabilized. Accordingly, an inertial sensor with more excellent output stability can be provided.

Furthermore, according to this configuration, the signals detected by the second detection element and the fourth detection element can be output from the plurality of first terminals. With this configuration, since all the signals output from the inertial sensor can be acquired by electrically coupling the plurality of first terminals and the second connection terminals of the ICs with the second wires, electrical connection is easy.

In the inertial sensor, the first lid body may be provided between one first terminal of the plurality of first terminals and another first terminal different from the one first terminal.

According to this configuration, the stress received from the first lid body acts on more evenly without being concentrated on a part of the substrate. With this configuration, deviation of distortion due to the stress can be suppressed in the substrate and difference in fluctuation of the gap between the fixed electrode and the movable electrode of each detection element due to the distortion of the substrate can be reduced, and thus the signal output from the detection element is stabilized. Accordingly, an inertial sensor with more excellent output stability can be provided.

The inertial sensor may include a third detection element that is provided on the first surface and includes a third movable portion displaceable with respect to the substrate and a third fixed portion connected to the third movable portion and fixed to the substrate, and in which, in a plan view of the substrate, when the substrate is rectangular, the first detection element and the third detection element may be provided at line-symmetric positions with respect to a line parallel to the first surface and passing through an intersection point of diagonal lines of the substrate.

According to this configuration, it is possible to reduce the difference in fluctuation of the gap between the fixed electrode and the movable electrode of each detection element due to the distortion of the substrate. That is, when the substrate is distorted around the axis of symmetry of line symmetry, the gap between the first fixed electrode and the first movable electrode of the first detection element, and the gap between the third fixed electrode and the third movable electrode of the third detection element are substantially the same, and thus the signal output from the detection element is stabilized. Accordingly, an inertial sensor with more excellent output stability can be provided.

The inertial sensor may include a third detection element that is provided on the first surface and includes a third movable portion displaceable with respect to the substrate and a third fixed portion connected to the third movable portion and fixed to the substrate, in a plan view of the substrate, when the substrate is rectangular, the first detection element and the third detection element may be provided at point-symmetric positions with respect to the intersection point of the diagonal lines of the substrate.

According to this configuration, it is possible to reduce the difference in fluctuation of the gap between the fixed electrode and the movable electrode of each detection element due to the distortion of the substrate. That is, when the substrate is distorted around a symmetric point of point symmetry, the gap between the first fixed electrode and the first movable electrode of the first detection element and the gap between the third fixed electrode and the third movable electrode of the third detection element are substantially the same, and thus the signal output from the detection element is stabilized. Accordingly, an inertial sensor with more excellent output stability can be provided.

In the inertial sensor, in a plan view of the substrate, when the substrate is rectangular, the second hole may be provided at a position overlapping the intersection point of the diagonal lines of the substrate.

According to this configuration, the stress on the substrate received from the first lid body, the second lid body, and the casing acts on more evenly without being concentrated on a part of the substrate. With this configuration, deviation of distortion due to the stress can be suppressed in the substrate and the difference in fluctuation of the gap between the fixed electrode and the movable electrode of each detection element due to the distortion of the substrate can be reduced, and thus the signal output from the detection element is stabilized. Accordingly, an inertial sensor with more excellent output stability can be provided.

In the inertial sensor, the second hole may be provided at a position where the second hole does not overlap the first detection element in a plan view of the substrate.

According to this configuration, it is possible to suppress reduction in the areas of the first fixed electrode and the third fixed electrode. With this configuration, the area of the first fixed electrode facing the first movable electrode and the area of the third fixed electrode facing the third movable electrode are not reduced, and thus the capacitance to be detected is not reduced. Accordingly, the detection sensitivity of the inertial sensor can be maintained.

Furthermore, according to this configuration, airflow generated by the movement of the first movable portion and the third movable portion can be suppressed from flowing into the second space through the second hole. With this configuration, the second movable portion and the fourth movable portion are hardly displaced by the airflow generated by the movement of the first movable portion and the third movable portion, and desired detection accuracy can be exhibited. Accordingly, the detection accuracy of the inertial sensor can be maintained.

In the inertial sensor, the first fixed portion and the second fixed portion are provided at positions where the first and second fixed portions do not overlap each other in a plan view of the substrate.

According to this configuration, the physical vibration generated by the movement of the first movable portion and the third movable portion is hardly transmitted to the second movable portion and the fourth movable portion through the substrate, and the second and fourth movable portions are hardly displaced by the vibration. With this configuration, even when the first movable portion and the third movable portion excessively move, the fluctuation in the gap between the fixed electrode and the movable electrode of the second movable portion and the fourth movable portion due to vibration can be suppressed, and thus the signal output from the detection element is stabilized. Accordingly, an inertial sensor with more excellent output stability can be provided.

The electronic device includes the inertial sensor described above and a processing unit that processes an output from the inertial sensor.

According to this configuration, the electronic device can obtain the effect of the inertial sensor described above. That is, by providing a miniaturized inertial sensor, for example, miniaturization of the electronic device can be realized by reducing the area, or the performance can be improved by adding other elements to the increased accommodation space.

The vehicle includes the inertial sensor described above and a processing unit that processes an output from the inertial sensor.

According to this configuration, the vehicle can obtain the effect of the inertial sensor described above. That is, by providing a miniaturized inertial sensor, for example, the performance can be improved by adding other elements to the space in which the inertial sensor is accommodated, or the size of the vehicle can be reduced or a space inside the vehicle can be increased.

What is claimed is:

1. An inertial sensor comprising:
    a substrate;
    a first detection element that is provided on a first surface of the substrate and includes a first movable portion displaceable with respect to the substrate and a first fixed portion connected to the first movable portion and fixed to the substrate; and
    a second detection element that is provided on a second surface in a front-back relationship with the first surface and includes a second movable portion displaceable with respect to the substrate and a second fixed portion connected to the second movable portion and fixed to the substrate.

2. The inertial sensor according to claim 1, further comprising:
    a first lid body that forms a first space with the first surface; and
    a second lid body that forms a second space with the second surface, wherein
    the first detection element is accommodated in the first space,
    the second detection element is accommodated in the second space,
    the first lid body is provided with a first hole sealed with a sealing material, and
    the substrate is provided with a second hole making the first space and the second space communicate with each other.

3. The inertial sensor according to claim 2, further comprising:
    a plurality of first terminals provided outside the first space on the first surface;
    a plurality of second terminals provided on the second surface and provided in the second space; and
    a penetrating electrode provided on the substrate and electrically coupling any one of the plurality of first terminals to any one of the plurality of second terminals, wherein
    any one of the plurality of first terminals is electrically coupled to the first detection element, and
    any one of the plurality of second terminals is electrically coupled to the second detection element.

4. The inertial sensor according to claim 3, wherein
    the first lid body is provided between one first terminal of the plurality of first terminals and another first terminal different from the one first terminal.

5. The inertial sensor according to claim 1, further comprising:
    a third detection element that is provided on the first surface and includes a third movable portion displaceable with respect to the substrate and a third fixed portion connected to the third movable portion and fixed to the substrate, wherein in a plan view of the substrate, when the substrate is rectangular, the first detection element and the third detection element are provided at line-symmetric positions with respect to a line parallel to the first surface and passing through an intersection point of diagonal lines of the substrate.

6. The inertial sensor according to claim 1, further comprising:

a third detection element that is provided on the first surface and includes a third movable portion displaceable with respect to the substrate and a third fixed portion connected to the third movable portion and fixed to the substrate, wherein in a plan view of the substrate, when the substrate is rectangular, the first detection element and the third detection element are provided at point-symmetric positions with respect to an intersection point of diagonal lines of the substrate.

7. The inertial sensor according to claim 2, wherein in a plan view of the substrate, when the substrate is rectangular, the second hole is provided at a position where the second hole overlaps an intersection point of diagonal lines of the substrate.

8. The inertial sensor according to claim 2, wherein the second hole is provided at a position where the second hole does not overlap the first detection element in a plan view of the substrate.

9. The inertial sensor according to claim 1, wherein the first fixed portion and the second fixed portion are provided at positions where the first and second fixed portions do not overlap each other in a plan view of the substrate.

10. An electronic device comprising:

the inertial sensor according to claim 1; and a processing unit that processes an output from the inertial sensor.

11. A vehicle comprising:

the inertial sensor according to claim 1; and a processing unit that processes an output from the inertial sensor.

* * * * *